United States Patent
Bechstein et al.

(10) Patent No.: US 11,526,240 B1
(45) Date of Patent: Dec. 13, 2022

(54) REDUCING SENSITIVITY TO LEAKAGE VARIATION FOR PASSIVE STYLUS

(71) Applicant: Apple Inc., Cupertino, CA (US)

(72) Inventors: Daniel Jacob Benjamin Bechstein, Mountain View, CA (US); Ullas Chandra Sekhar Pazhayaveetil, Campbell, CA (US); Jason Chueh-Ren Hu, Palo Alto, CA (US); Robert Ubo Liu, Santa Clara, CA (US); Rexford J. Garland, Kansas City, MO (US); John Stephen Smith, San Jose, CA (US); Blake R. Marshall, San Jose, CA (US)

(73) Assignee: Apple Inc., Cupertino, CA (US)

(*) Notice: Subject to any disclaimer, the term of this patent is extended or adjusted under 35 U.S.C. 154(b) by 0 days.

(21) Appl. No.: 17/448,774

(22) Filed: Sep. 24, 2021

Related U.S. Application Data

(60) Provisional application No. 63/083,770, filed on Sep. 25, 2020.

(51) Int. Cl.
*G06F 3/044* (2006.01)
*H01L 29/872* (2006.01)
(Continued)

(52) U.S. Cl.
CPC ........ *G06F 3/0441* (2019.05); *G06F 3/03545* (2013.01); *G06F 3/04162* (2019.05); *H01L 29/872* (2013.01)

(58) Field of Classification Search
CPC ............... G06F 3/0441; G06F 3/04162; G06F 3/03545; H01L 29/872
See application file for complete search history.

(56) References Cited

U.S. PATENT DOCUMENTS

| 5,414,227 A | 5/1995 | Schubert et al. |
| 7,567,414 B2 | 7/2009 | Bertin et al. |

(Continued)

FOREIGN PATENT DOCUMENTS

| EP | 2466431 A1 | 6/2012 |
| EP | 2624104 A2 | 8/2013 |

(Continued)

OTHER PUBLICATIONS

Advisory Action received for U.S. Appl. No. 14/848,289, dated Sep. 25, 2018, 3 pages.

(Continued)

*Primary Examiner* — Lisa S Landis
(74) *Attorney, Agent, or Firm* — Kubota & Basol LLP

(57) ABSTRACT

An input device such as a stylus for providing input to a touch-sensitive surface with reduced sensitivity to leakage current variations over temperature is disclosed. A passive stylus may include one or more diodes in parallel with one or more bleed resistors. The non-linear load of the diode and resistor network can be operative to provide a stylus electric field in response to a stimulation signal from an electronic device that can be capacitively coupled to, and sensed by, the electronic device. The signal sensed by the electronic device can be a function of the total leakage current, which can vary greatly as a function of temperature and frequency. In order to improve performance, the diode and resistor network, including the bleed resistor(s) and diodes within that network, can be selected and/or designed to provide a reduced variation in the leakage current and more accurate stylus detection.

19 Claims, 9 Drawing Sheets

(51) Int. Cl.
*G06F 3/0354* (2013.01)
*G06F 3/041* (2006.01)

(56) References Cited

U.S. PATENT DOCUMENTS

| | | |
|---|---|---|
| 8,199,132 B1 | 6/2012 | Oda et al. |
| 8,493,359 B2 | 7/2013 | Wright et al. |
| 8,657,814 B2 | 2/2014 | Werneth et al. |
| 8,773,405 B1 | 7/2014 | Ryshtun et al. |
| 8,816,985 B1 | 8/2014 | Tate et al. |
| 8,854,147 B2 | 10/2014 | Lin |
| 9,018,547 B2 | 4/2015 | Rimon et al. |
| 9,117,677 B2 | 8/2015 | Ma et al. |
| 9,189,088 B2 | 11/2015 | Tsao et al. |
| 9,310,943 B1 | 4/2016 | Omelchuk et al. |
| 9,383,835 B2 | 7/2016 | Lo et al. |
| 9,594,440 B2 | 3/2017 | Park et al. |
| 9,606,680 B1 | 3/2017 | Sundara-rajan |
| 9,612,671 B1 | 4/2017 | Blaszczak et al. |
| 10,558,293 B2 | 2/2020 | Wigdor et al. |
| 11,079,862 B2 | 8/2021 | Brunet et al. |
| 2007/0195068 A1 | 8/2007 | Kable et al. |
| 2008/0156546 A1 | 7/2008 | Hauck |
| 2009/0008162 A1 | 1/2009 | Yang et al. |
| 2009/0273579 A1 | 11/2009 | Zachut et al. |
| 2009/0289922 A1 | 11/2009 | Henry |
| 2010/0117661 A1 | 5/2010 | Bruwer et al. |
| 2010/0315384 A1 | 12/2010 | Hargreaves et al. |
| 2011/0297458 A1 | 12/2011 | Mao et al. |
| 2012/0146960 A1 | 6/2012 | Shih et al. |
| 2012/0154340 A1 | 6/2012 | Vuppu et al. |
| 2012/0268428 A1 | 10/2012 | Nakata et al. |
| 2012/0327042 A1 | 12/2012 | Harley et al. |
| 2012/0331546 A1 | 12/2012 | Falkenburg et al. |
| 2013/0088465 A1 | 4/2013 | Geller et al. |
| 2013/0106718 A1 | 5/2013 | Sundara-rajan |
| 2013/0141397 A1 | 6/2013 | Dunagan |
| 2013/0194225 A1 | 8/2013 | Shen et al. |
| 2013/0285900 A1 | 10/2013 | Liu |
| 2014/0146009 A1 | 5/2014 | Huang |
| 2015/0091856 A1 | 4/2015 | Park et al. |
| 2015/0123923 A1 | 5/2015 | Stern |
| 2015/0123932 A1* | 5/2015 | Collins ................ G06F 3/0441 345/174 |
| 2015/0138164 A1 | 5/2015 | Hinson |
| 2015/0160744 A1 | 6/2015 | Mohindra et al. |
| 2015/0193024 A1 | 7/2015 | Kai et al. |
| 2015/0277618 A1 | 10/2015 | Bulea |
| 2015/0309598 A1 | 10/2015 | Zeliff et al. |
| 2015/0355732 A1 | 12/2015 | Mann |
| 2016/0048224 A1 | 2/2016 | Brunet et al. |
| 2016/0162045 A1 | 6/2016 | Wincent |
| 2016/0179271 A1 | 6/2016 | Vandermeijden |
| 2016/0266663 A1 | 9/2016 | Holsen |
| 2016/0313825 A1 | 10/2016 | Hotelling et al. |
| 2016/0320913 A1 | 11/2016 | Gao et al. |
| 2017/0010697 A1 | 1/2017 | Jiang et al. |
| 2017/0068344 A1 | 3/2017 | Bhandari et al. |
| 2017/0075441 A1 | 3/2017 | Leigh et al. |
| 2017/0075446 A1 | 3/2017 | Vandermeijden |
| 2017/0212635 A1 | 7/2017 | Cordeiro et al. |
| 2017/0262100 A1 | 9/2017 | Leigh et al. |
| 2017/0285772 A1 | 10/2017 | Yamamoto |
| 2017/0308189 A1 | 10/2017 | Peretz et al. |
| 2017/0344174 A1 | 11/2017 | Pant et al. |
| 2018/0181245 A1 | 6/2018 | Beck et al. |
| 2018/0309190 A1 | 10/2018 | Niakan |
| 2018/0338065 A1 | 11/2018 | Zyskind et al. |
| 2019/0155408 A1 | 5/2019 | Hou et al. |
| 2019/0155411 A1 | 5/2019 | Kinrot et al. |
| 2019/0324564 A1 | 10/2019 | Brunet et al. |
| 2019/0371787 A1 | 12/2019 | Mandal |
| 2020/0019257 A1 | 1/2020 | Chang et al. |
| 2020/0192521 A1 | 6/2020 | Case et al. |
| 2020/0201505 A1 | 6/2020 | Jung et al. |
| 2021/0026464 A1 | 1/2021 | Tamada et al. |
| 2021/0232240 A1 | 7/2021 | Smith |
| 2021/0240325 A1 | 8/2021 | Smith |
| 2021/0286493 A1 | 9/2021 | Wang et al. |
| 2021/0303152 A1 | 9/2021 | Hosur et al. |
| 2021/0325444 A1 | 10/2021 | Chong |
| 2022/0091685 A1 | 3/2022 | Bechstein et al. |
| 2022/0095443 A1 | 3/2022 | Bechstein et al. |
| 2022/0100310 A1 | 3/2022 | Shahsavar et al. |
| 2022/0100341 A1 | 3/2022 | Seyed Mousavi et al. |

FOREIGN PATENT DOCUMENTS

| | | |
|---|---|---|
| EP | 2672494 A1 | 12/2013 |
| EP | 2813918 A1 | 12/2014 |
| EP | 2624104 A3 | 3/2016 |
| EP | 3326050 A1 | 5/2018 |
| WO | 2017/044428 A1 | 3/2017 |
| WO | 2019/036857 A1 | 2/2019 |
| WO | 2020/023640 A1 | 1/2020 |
| WO | 2020/027818 A1 | 2/2020 |

OTHER PUBLICATIONS

Final Office Action received for U.S. Appl. No. 14/848,289, dated Jun. 21, 2018, 11 pages.
International Search Report received for PCT Patent Application No. PCT/US2016/048590, dated Feb. 7, 2017, 6 pages.
International Search Report received for PCT Patent Application No. PCT/US2016/048630, dated Nov. 18, 2016, 3 pages.
Non Final Office Action received for U.S. Appl. No. 14/848,277, dated Nov. 18, 2016, 18 Pages.
Non Final Office Action received for U.S. Appl. No. 14/848,277, dated Sep. 19, 2017, 11 Pages.
Non-Final Office Action received for U.S. Appl. No. 14/848,289, dated Nov. 3, 2017, 18 pages.
Non-Final Office Action received for U.S. Appl. No. 14/848,289, dated Nov. 17, 2016, 11 pages.
Non-Final Office Action received for U.S. Appl. No. 16/836,789, dated Oct. 1, 2021, 27 pages.
Non-Final Office Action received for U.S. Appl. No. 17/031,570, dated Dec. 17, 2021, 11 pages.
Non-Final Office Action received for U.S. Appl. No. 17/031,549, dated Oct. 20, 2021, 13 pages.
Non-Final Office Action received for U.S. Appl. No. 17/031,549, dated Sep. 29, 2021, 14 pages.
Notice of Allowance received for U.S. Appl. No. 14/848,277, dated May 8, 2018, 5 Pages.
Notice of Allowance received for U.S. Appl. No. 14/848,289, dated Nov. 21, 2018, 6 pages.
Notice of Allowance received for U.S. Appl. No. 17/161,499, dated Aug. 12, 2021, 9 pages.
Notice of Allowance received for U.S. Appl. No. 17/161,499, dated Dec. 1, 2021, 8 pages.
Final Office Action received for U.S. Appl. No. 17/031,570, dated May 13, 2022, 12 Pages.
Notice of Allowance received for U.S. Appl. No. 16/836,789, dated Feb. 18, 2022, 9 pages.
Notice of Allowance received for U.S. Appl. No. 16/836,789, dated May 25, 2022, 8 Pages.
Notice of Allowance received for U.S. Appl. No. 17/031,549, dated Feb. 1, 2022, 8 pages.
Notice of Allowance received for U.S. Appl. No. 17/031,549, dated May 6, 2022, 8 pages.

* cited by examiner

REDUCING SENSITIVITY TO LEAKAGE VARIATION FOR PASSIVE STYLUS

CROSS-REFERENCE TO RELATED APPLICATIONS

This application claims the benefit of U.S. Provisional Application No. 63/083,770, filed Sep. 25, 2020, the content of which is incorporated herein by reference in its entirety for all purposes.

FIELD

This relates to an input device such as a stylus for providing input to a touch-sensitive surface, and more particularly, to reducing the sensitivity of the input device to leakage current variations over temperature.

BACKGROUND

Many types of input devices are presently available for performing operations in a computing system, such as buttons or keys, mice, trackballs, joysticks, touch panels, touch screens and the like. Touch screens, in particular, are popular because of their ease and versatility of operation as well as their declining price. Touch screens can include a touch panel, which can be a clear panel with a touch-sensitive surface, and a display device such as a liquid crystal display (LCD), light emitting diode (LED) display or organic light emitting diode (OLED) display that can be positioned partially or fully behind the panel so that the touch-sensitive surface can cover at least a portion of the viewable area of the display device. Touch screens can allow a user to perform various functions by touching the touch panel using a finger, stylus or other object at a location often dictated by a user interface (UI) being displayed by the display device. In general, touch screens can recognize a touch and the position of the touch on the touch panel, and the computing system can then interpret the touch in accordance with the display appearing at the time of the touch, and thereafter can perform one or more actions based on the touch. In some examples, touch panels can be included in other input devices that are separate from any display screen, such as trackpads. In the case of some touch sensing systems, a physical touch on the display is not needed to detect a touch. For example, in some capacitive-type touch sensing systems, fringing electrical fields used to detect touch can extend beyond the surface of the display, and objects approaching near the surface may be detected near the surface without actually touching the surface.

As mentioned above, a stylus is one type of input device that can provide touch input. In some examples, a stylus can be an active stylus that includes a power supply and generates a stylus signal that can be detected by a touch-sensitive surface of the electronic device. In other examples, a stylus can be a passive stylus that does not include a power supply. The passive stylus can include stylus I/O circuitry that can capacitively couple to a stimulus signal generated by transmit circuitry within the electronic device, and generate a stylus electric field that may capacitively couple to sense circuitry in the electronic device to enable the electronic device to detect and estimate the location of the stylus.

SUMMARY

This relates to an input device such as a stylus for providing input to a touch-sensitive surface, and more particularly, to reducing the sensitivity of the input device to leakage current variations over temperature. A passive stylus may include one or more diodes in parallel with one or more bleed resistors. The non-linear load of the diode and resistor network can be operative to provide a stylus electric field in response to a stimulation signal from an electronic device that can be capacitively coupled to, and sensed by, the electronic device. The signal sensed by the electronic device can be a function of the total leakage current of the network. Ideally, the leakage current should be uniform across the temperature and frequency range of interest, but in reality the total leakage current can vary greatly as a function of temperature and frequency. In order to improve performance, the diode and resistor network, including the bleed resistor(s) and diodes within that network, can be selected and/or designed to provide a reduced variation in the leakage current and more accurate stylus detection.

DETAILED DESCRIPTION

In the following description of examples, reference is made to the accompanying drawings which form a part hereof, and in which it is shown by way of illustration specific examples that can be practiced. It is to be understood that other examples can be used and structural changes can be made without departing from the scope of the disclosed examples.

Examples of the disclosure relate to an input device such as a stylus for providing input to a touch-sensitive surface, and more particularly, to reducing the sensitivity of the input device to leakage current variations over temperature. A passive stylus may include one or more diodes in parallel with one or more bleed resistors. The non-linear load of the diode and resistor network can be operative to provide a stylus electric field in response to a stimulation signal from an electronic device that can be capacitively coupled to, and sensed by, the electronic device. The signal sensed by the electronic device can be a function of the total leakage current. Ideally, the leakage current should be uniform across the temperature and frequency range of interest, but in reality the total leakage current can vary greatly as a function of temperature and frequency. In order to improve performance, the diode and resistor network, including the bleed resistor(s) and diodes within that network, can be selected and/or designed to provide a reduced variation in the leakage current and more accurate stylus detection.

Some examples of the disclosure reduce variations in diode leakage current over temperature by reducing the leakage current of the diodes, or by compensating for variations in leakage current over temperature. In some examples, the bleed resistance can be selected to compensate for variations in diode leakage current over temperature by reducing the overall network (resistance and diode) variation in leakage current. This can be accomplished by selecting a particular leakage resistance value, or by selecting a resistance with a particular temperature coefficient of resistance (TCR) to compensate for the leakage current trend of the diode. In other examples, the diode configuration can be modified to reduce the impact of large leakage current variations over temperature. This can be accomplished by adding more diodes, changing diode types, or by diode parameter tuning.

Figure 1A:
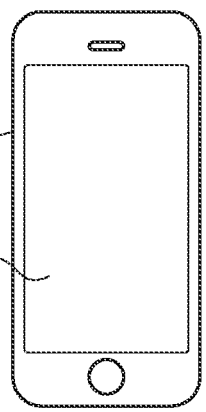
FIGS. 1A-1E illustrate example systems that can receive input from an input device such as a stylus having reduced sensitivity to leakage current variations over temperature according to some examples of the disclosure.
Figure 1B:
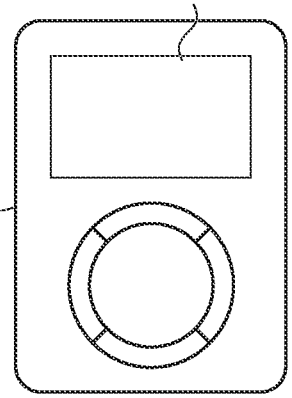
Figure 1C:
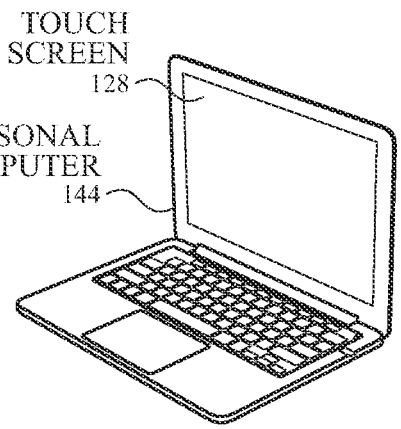
Figure 1D:
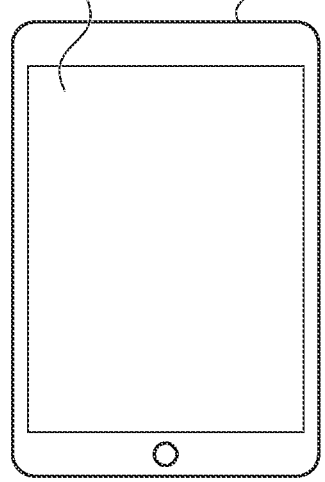
Figure 1E:
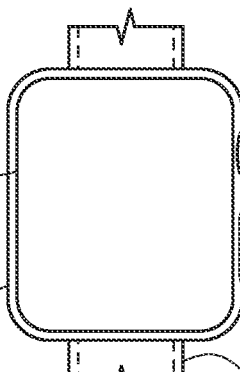

FIGS. 1A-1E illustrate example systems that can receive input from an input device such as a stylus having reduced sensitivity to leakage current variations over temperature according to some examples of the disclosure. FIG. 1A illustrates an example mobile telephone 136 that includes a touch screen 124 that can receive input from a handheld input device having reduced sensitivity to leakage current variations over temperature according to examples of the disclosure. FIG. 1B illustrates an example digital media player 140 that includes a touch screen 126 that can receive input from a handheld input device having reduced sensitivity to leakage current variations over temperature according to examples of the disclosure. FIG. 1C illustrates an example personal computer 144 that includes a touch screen 128 that can receive input from a handheld input device having reduced sensitivity to leakage current variations over temperature according to examples of the disclosure. FIG. 1D illustrates an example tablet computing device 148 that includes a touch screen 130 that can receive input from a handheld input device having reduced sensitivity to leakage current variations over temperature according to examples of the disclosure. FIG. 1E illustrates an example wearable device 150 attachable to a user using a strap 152 and including a touch screen 132 that can receive input from a handheld input device having reduced sensitivity to leakage current variations over temperature according to examples of the disclosure. It is understood that other devices can also receive input from a handheld input device having reduced sensitivity to leakage current variations over temperature as well.

In some examples, touch screens 124, 126, 128, 130 and 132 can be based on self-capacitance. A self-capacitance based touch system can include a matrix of small, individual plates of conductive material or groups of individual plates of conductive material forming larger conductive regions that can be referred to as touch electrodes or as touch node electrodes. For example, a touch screen can include a plurality of touch electrodes, each touch electrode identifying or representing a unique location (e.g., a touch node) on the touch screen at which touch or proximity is to be sensed, and each touch node electrode being electrically isolated from the other touch node electrodes in the touch screen/panel. Such a touch screen can be referred to as a pixelated self-capacitance touch screen, though it is understood that in some examples, the touch node electrodes on the touch screen can be used to perform scans other than self-capacitance scans on the touch screen (e.g., mutual capacitance scans). During operation, a touch node electrode can be stimulated with an alternating current (AC) waveform, and the self-capacitance to ground of the touch node electrode can be measured. As an object approaches the touch node electrode, the self-capacitance to ground of the touch node electrode can change (e.g., increase). This change in the self-capacitance of the touch node electrode can be detected and measured by the touch sensing system to determine the positions of multiple objects when they touch, or come in proximity to, the touch screen. In some examples, the touch node electrodes of a self-capacitance based touch system can be formed from rows and columns of conductive material, and changes in the self-capacitance to ground of the rows and columns can be detected, similar to above. In some examples, a touch screen can be multi-touch, single touch, projection scan, full-imaging multi-touch, capacitive touch, etc.

In some examples, touch screens 124, 126, 128, 130 and 132 can be based on mutual capacitance. A mutual capacitance based touch system can include electrodes arranged as drive and sense lines that may cross over each other on different layers (in a double-sided configuration), or may be adjacent to each other on the same layer. The crossing or adjacent locations can form touch nodes. During operation, the drive line can be stimulated with an AC waveform and the mutual capacitance of the touch node can be measured. As an object approaches the touch node, the mutual capacitance of the touch node can change (e.g., decrease). This change in the mutual capacitance of the touch node can be detected and measured by the touch sensing system to determine the positions of multiple objects when they touch, or come in proximity to, the touch screen. As described herein, in some examples, a mutual capacitance based touch system can form touch nodes from a matrix of small, individual plates of conductive material.

In some examples, touch screens 124, 126, 128, 130 and 132 can be based on mutual capacitance and/or self-capacitance. The electrodes can be arranged as a matrix of small, individual plates of conductive material or as drive lines and sense lines, or in another pattern. The electrodes can be configurable for mutual capacitance or self-capacitance sensing or a combination of mutual and self-capacitance sensing. For example, in one mode of operation electrodes can be configured to sense mutual capacitance between electrodes and in a different mode of operation electrodes can be configured to sense self-capacitance of electrodes. In some examples, some of the electrodes can be configured to sense mutual capacitance therebetween and some of the electrodes can be configured to sense self-capacitance thereof.

In some examples, touch screens 124, 126, 128, 130, and 132 can sense an active input device such as an active stylus. The active input device can produce a device signal that can capacitively couple to the touch electrodes of touch screen 124, 126, 128, 130, and 132 to be sensed by sense circuitry coupled to the touch electrodes. In other examples, touch screens 124, 126, 128, 130, and 132 can sense a passive input device such as a passive stylus that does not include a power supply. The passive stylus can include one or more conductive components that can capacitively couple to an electrode of the touch screen to produce or modify a received signal that is thereafter sensed by the electronic device. For example, a passive stylus can include stylus I/O circuitry that can capacitively couple to a stimulus signal generated by transmit circuitry within the electronic device, and thereafter generate a suitable stylus electric field that may capacitively couple to sense circuitry in the electronic device to enable the electronic device to detect and estimate the location of the stylus. In some examples, a touch screen including row electrodes and column electrodes can determine the location of the stylus along the rows and along the columns to determine the location of the stylus on the touch screen.

Figure 2:
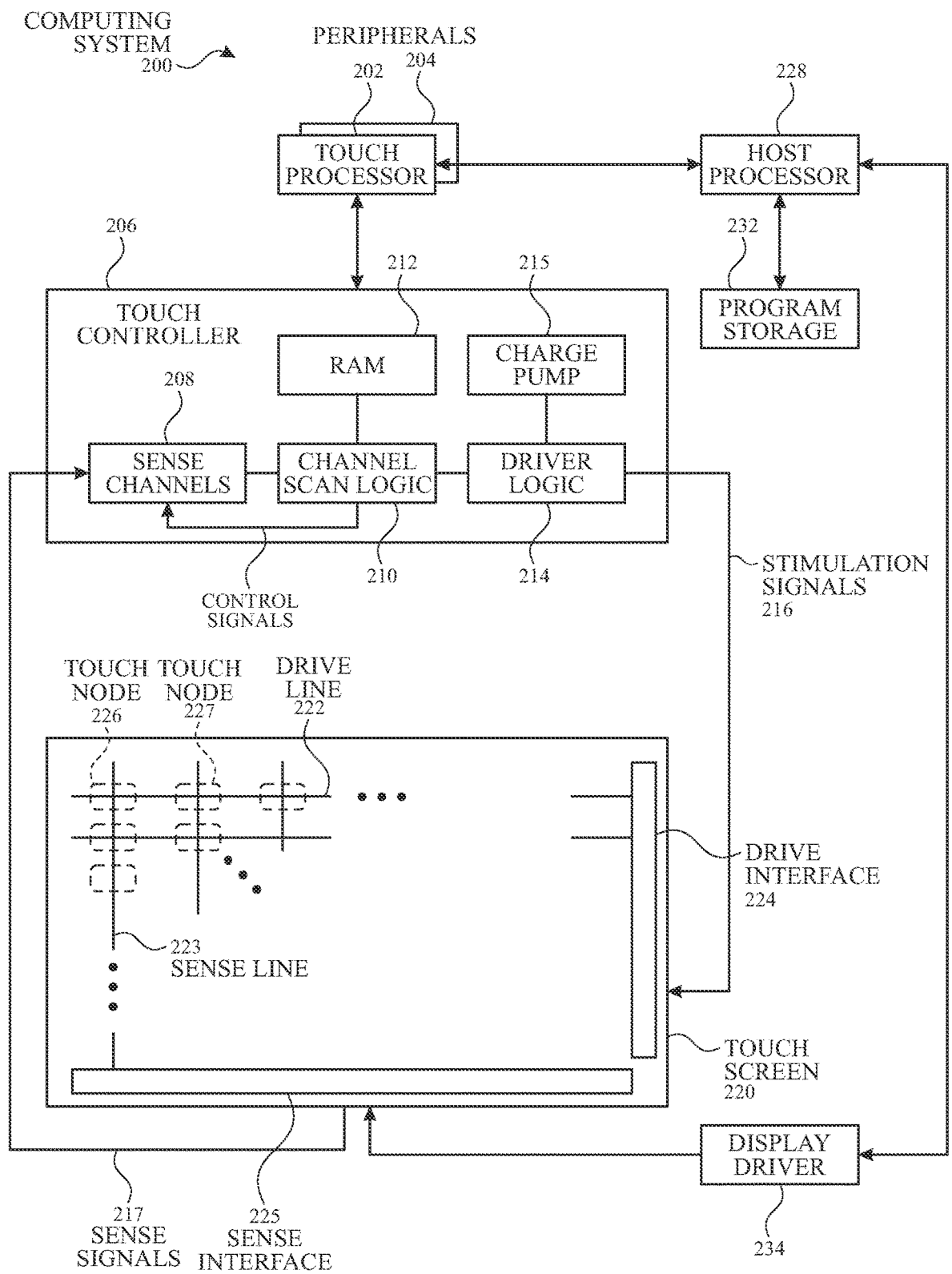
FIG. 2 illustrates an example computing system including a touch screen that can receive input from an input device such as a stylus having reduced sensitivity to leakage current variations over temperature according to some examples of the disclosure.

FIG. 2 illustrates an example computing system including a touch screen that can receive input from an input device such as a stylus having reduced sensitivity to leakage current variations over temperature according to some examples of the disclosure. Computing system 200 can be included in, for example, a mobile phone, tablet, touchpad, portable or desktop computer, portable media player, wearable device or any mobile or non-mobile computing device that includes a touch screen. Although the example of FIG. 2 illustrates a touch screen, in other examples computing system 200 can be included in an electronic device employing a touch sensor panel. Computing system 200 can include a touch sensing system including one or more touch processors 202, peripherals 204, a touch controller 206, and touch sensing circuitry (described in more detail below). Peripherals 204 can include, but are not limited to, random access memory (RAM) or other types of memory or storage, watchdog timers and the like. Touch controller 206 can include, but is not limited to, one or more sense channels 208 (e.g., including one or more of sensing circuit 314), channel scan logic 210 and driver logic 214. Channel scan logic 210 can access RAM 212, autonomously read data from the sense channels and provide control for the sense channels. In addition, channel scan logic 210 can control driver logic 214 to generate stimulation signals 216 at various frequencies and/or phases that can be selectively applied to drive regions of the touch sensing circuitry of touch screen 220, as described in more detail below. In some examples, touch controller 206, touch processor 202 and peripherals 204 can be integrated into a single application specific integrated circuit (ASIC), and in some examples can be integrated with touch screen 220 itself.

It should be apparent that the architecture shown in FIG. 2 is only one example architecture of computing system 200, and that the system could have more or fewer components than shown, or a different configuration of components. The various components shown in FIG. 2 can be implemented in hardware, software, firmware or any combination thereof, including one or more signal processing and/or application specific integrated circuits.

Computing system 200 can include a host processor 228 for receiving outputs from touch processor 202 and performing actions based on the outputs. For example, host processor 228 can be connected to program storage 232 and a display controller/driver 234 (e.g., a Liquid-Crystal Display (LCD) driver). It is understood that although some examples of the disclosure may be described with reference to LCD displays, the scope of the disclosure is not so limited and can extend to other types of displays, such as Light-Emitting Diode (LED) displays, including Organic LED (OLED), Active-Matrix Organic LED (AMOLED) and Passive-Matrix Organic LED (PMOLED) displays. Display driver 234 can provide voltages on select (e.g., gate) lines to each pixel transistor and can provide data signals along data lines to these same transistors to control the pixel display image.

Host processor 228 can use display driver 234 to generate a display image on touch screen 220, such as a display image of a user interface (UI), and can use touch processor 202 and touch controller 206 to detect a touch on or near touch screen 220, such as a touch input to the displayed UI. The touch input can be used by computer programs stored in program storage 232 to perform actions that can include, but are not limited to, moving an object such as a cursor or pointer, scrolling or panning, adjusting control settings, opening a file or document, viewing a menu, making a selection, executing instructions, operating a peripheral device connected to the host device, answering a telephone call, placing a telephone call, terminating a telephone call, changing the volume or audio settings, storing information related to telephone communications such as addresses, frequently dialed numbers, received calls, missed calls, logging onto a computer or a computer network, permitting authorized individuals access to restricted areas of the computer or computer network, loading a user profile associated with a user's preferred arrangement of the computer desktop, permitting access to web content, launching a particular program, encrypting or decoding a message, and/or the like. Host processor 228 can also perform additional functions that may not be related to touch processing.

Note that one or more of the functions described herein, including multi-frequency stylus scans, can be performed by firmware stored in memory (e.g., one of the peripherals 204 in FIG. 2) and executed by touch processor 202 and/or touch controller 206, or stored in program storage 232 and executed by host processor 228. The firmware can also be stored and/or transported within any non-transitory computer-readable storage medium for use by or in connection with an instruction execution system, apparatus, or device, such as a computer-based system, processor-containing system, or other system that can fetch the instructions from the instruction execution system, apparatus, or device and execute the instructions. In the context of this document, a "non-transitory computer-readable storage medium" can be any medium (excluding signals) that can contain or store the program for use by or in connection with the instruction execution system, apparatus, or device. In some examples, RAM 212 or program storage 232 (or both) can be a non-transitory computer readable storage medium. One or both of RAM 212 and program storage 232 can have stored therein instructions, which when executed by touch processor 202 or host processor 228 or both, can cause the device including computing system 200 to perform one or more functions and methods of one or more examples of this disclosure. The computer-readable storage medium can include, but is not limited to, an electronic, magnetic, optical, electromagnetic, infrared, or semiconductor system, apparatus or device, a portable computer diskette (magnetic), a random access memory (RAM) (magnetic), a read-only memory (ROM) (magnetic), an erasable programmable read-only memory (EPROM) (magnetic), a portable optical disc such a CD, CD-R, CD-RW, DVD, DVD-R, or DVD-RW, or flash memory such as compact flash cards, secured digital cards, USB memory devices, memory sticks, and the like.

The firmware can also be propagated within any transport medium for use by or in connection with an instruction execution system, apparatus, or device, such as a computer-based system, processor-containing system, or other system that can fetch the instructions from the instruction execution system, apparatus, or device and execute the instructions. In the context of this document, a "transport medium" can be any medium that can communicate, propagate or transport the program for use by or in connection with the instruction execution system, apparatus, or device. The transport medium can include, but is not limited to, an electronic, magnetic, optical, electromagnetic or infrared wired or wireless propagation medium.

Touch screen 220 can be used to derive touch information at multiple discrete locations of the touch screen, referred to herein as touch nodes. Touch screen 220 can include touch sensing circuitry that can include a capacitive sensing medium having a plurality of drive lines 222 and a plurality of sense lines 223. It should be noted that the term "lines" is sometimes used herein to mean simply conductive pathways, as one skilled in the art will readily understand, and is not limited to elements that are strictly linear, but includes pathways that change direction, and includes pathways of different size, shape, materials, etc. Drive lines 222 can be driven by stimulation signals 216 from driver logic 214 through a drive interface 224, and resulting sense signals 217 generated in sense lines 223 can be transmitted through a sense interface 225 to sense channels 208 in touch controller 206. In this way, drive lines and sense lines can be part of the touch sensing circuitry that can interact to form capacitive touch nodes, which can be thought of as touch picture elements (touch pixels) and referred to herein as touch nodes, such as touch nodes 226 and 227. This way of understanding can be particularly useful when touch screen 220 is viewed as capturing an "image" of touch ("touch image"). In other words, after touch controller 206 has determined whether a touch has been detected at each touch nodes in the touch screen, the pattern of touch nodes in the touch screen at which a touch occurred can be thought of as an "image" of touch (e.g., a pattern of fingers touching the touch screen). As used herein, an electrical component "coupled to" or "connected to" another electrical component encompasses a direct or indirect connection providing electrical path for communication or operation between the coupled components. Thus, for example, drive lines 222 may be directly connected to driver logic 214 or indirectly connected to drive logic 214 via drive interface 224 and sense lines 223 may be directly connected to sense channels 208 or indirectly connected to sense channels 208 via sense interface 225. In either case an electrical path for driving and/or sensing the touch nodes can be provided.

In some examples, touch screen 220 can be an integrated touch screen in which touch sensing circuit elements of the touch sensing system can be integrated into the display pixel stack-ups of a display. The circuit elements in touch screen 220 can include, for example, elements that can exist in LCD or other displays (LED display, OLED display, etc.), such as one or more pixel transistors (e.g., thin film transistors (TFTs)), gate lines, data lines, pixel electrodes and common electrodes. In a given display pixel, a voltage between a pixel electrode and a common electrode can control a luminance of the display pixel. The voltage on the pixel electrode can be supplied by a data line through a pixel transistor, which can be controlled by a gate line. It is noted that circuit elements are not limited to whole circuit components, such as a whole capacitor, a whole transistor, etc., but can include portions of circuitry, such as only one of the two plates of a parallel plate capacitor.

Figure 3:
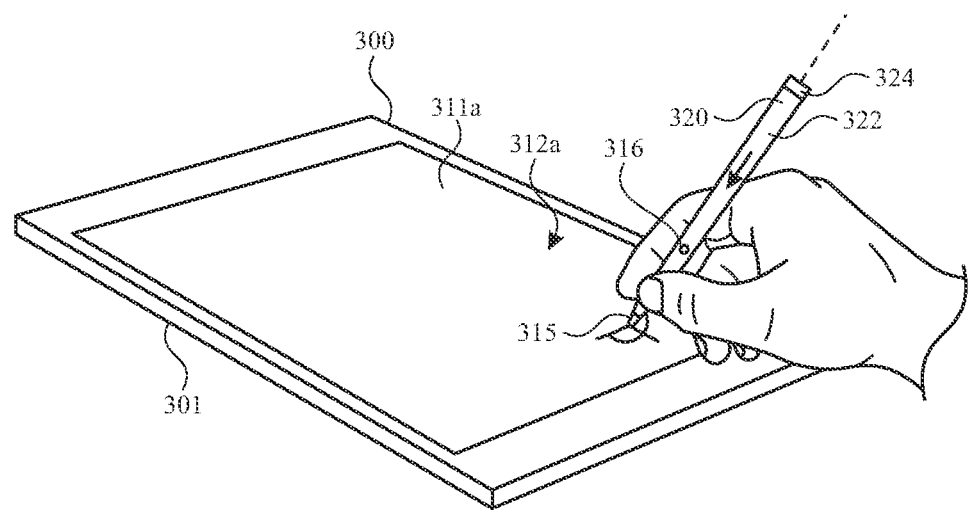
FIG. 3 illustrates a handheld input device such as a stylus and an electronic device according to some examples of the disclosure.

FIG. 3 illustrates a handheld input device 320 such as a stylus and an electronic device 300 according to some examples of the disclosure. A handheld input device 320 (e.g., a stylus, marking tool, smart pen, smart brush, wand, chisel, user-manipulated electronic input device, or any other suitable accessory, such as a glove) may be configured to provide input to electronic device 300 (e.g., a tablet computer, laptop computer, desktop computer, and the like) when the handheld input device 320 is proximate to (in contact with, or in proximity to) a surface of the electronic device. (Although the term "stylus" is primarily used hereinbelow for convenience, it should be understood that any reference to the term "stylus" is inclusive of other handheld input devices such as those listed above.) A system user may manipulate the orientation and position of stylus 320 relative to a surface of a touch-sensitive display or panel of electronic device 300 to convey information to electronic device 300, such as, but not limited to, writing, sketching, scrolling, gaming, selecting user interface elements, moving user interface elements, and so on. In some examples, the surface of the touch-sensitive display of electronic device 300 may be a multi-touch display screen. However, in some examples, the surface of the touch-sensitive display of electronic device 300 may be a non-display surface of the touch-sensitive display, such as, but not limited to, a trackpad or drawing tablet. The touch-sensitive surface may be a foldable or flexible panel or display. Electronic device 300 may be used to capture free-form user input from stylus 320. For example, the user can slide, move, draw, or drag a tip of stylus 320 across the surface of the touch-sensitive display of electronic device 300, which, in response, may render a graphical object (e.g., a line) using a display positioned below the surface of the touch-sensitive display. In such an example, the rendered graphical object may follow or otherwise correspond to the path of stylus 320 across the surface of the touch-sensitive display of electronic device 300. The thickness and/or shape and/or intensity and/or any other suitable rendered characteristic of the rendered graphical object may vary based, at least in part, on one, some, or each of various characteristics, including, but not limited to, a force or speed with which the user moves stylus 320 across the surface of the touch-sensitive display, an angle of stylus 320 relative to the surface of the touch-sensitive display (e.g., the inclination of stylus 320 relative to a plane of the surface of the touch-sensitive display, a writing angle of stylus 320 relative to a horizontal writing line traversing the surface of the touch-sensitive display, etc.), a variable setting of a variable input component of stylus 320, which one of multiple tips of stylus 320 is interacting with the surface of the touch-sensitive display, a variable setting of an application running on electronic device 300 (e.g., a virtual drawing space application), and/or a combination thereof.

Electronic device 300 may be any portable, mobile, or hand-held electronic device configured to interact with stylus 320 for changing any suitable characteristic(s) of device 300 (e.g., any suitable graphical object input tool characteristics that may be utilized to render a graphical object) in response to manipulation of stylus 320 across a surface of the touch-sensitive display of electronic device 300. Alternatively, electronic device 300 may not be portable at all, but may instead be generally stationary. Electronic device 300 can include, but is not limited to, a media player, video player, still image player, game player, other media player, music recorder, movie or video camera or recorder, still camera, other media recorder, radio, medical equipment, domestic appliance, transportation vehicle instrument, musical instrument, calculator, cellular telephone, other wireless communication device, personal digital assistant, remote control, pager, computer (e.g., a desktop, laptop, tablet, server, etc.), merchant accessory (e.g., signature pad (e.g., as may be used in a check-out line of a merchant store during payment processing)), monitor, television, stereo equipment, set up box, set-top box, wearable device (e.g., watch, clothing, etc.), boom box, modem, router, printer, and combinations thereof. Electronic device 300 may include one or more components described above with reference to FIG. 2 (e.g., electronic device 300 can be the same as electronic device 200).

In the example of FIG. 3, a user can manipulate the orientation and position of stylus 320 relative to surface of the touch-sensitive display input component (e.g., a particular input component) of electronic device 300 in order to convey information to electronic device 300. Electronic device 300 may be configured to perform or coordinate multiple operations such as, but not limited to, locating stylus 320, estimating the angular position of stylus 320, estimating the magnitude of force by stylus 320 to surface of the touch-sensitive display, determining a variable setting of a variable input component of stylus 320, determining a variable setting of an application running on electronic device 300 (e.g., a virtual drawing space application), and/or a combination thereof. The electronic device 300 can perform these and other operations at the same time or at different times.

As shown in FIG. 3, the user can grip a barrel or handle or body portion 322 of stylus 320 extending between a front tip portion 315 of stylus 320 and a rear tip portion 324 of stylus 320. The user may interact with the electronic device 300 by sliding a tip portion, such as tip portion 315, of stylus 320 across surface of the touch-sensitive display of electronic device 300. As shown in FIG. 3, for example, device 300 can be a tablet computing device. It should be understood that many other electronic devices (with or without displays positioned below a stylus surface of the touch-sensitive display), such as any of the electronic device described above with reference to FIGS. 1A-1E, can be used to detect stylus 322. For example, the electronic device can be implemented as a peripheral input device, a trackpad, a drawing tablet, and the like.

In some examples, stylus 320 may have a general form of a writing instrument, such as a pen or a pencil-like structure with a cylindrical body 322 with two ends, such as a first end terminated at front portion 315 and a second end terminated at rear portion 324. One or more of portions 315 and 324 can be removable, affixed to body 322, or an integral part of body 322. In some examples, other input devices with different form factors are possible.

The stylus 320 can include one or more input or output components, which can be located at one or more of portions 315-324 of stylus 320. These components can include a button, a dial, a slide, a force pad, a touch pad, audio component, haptic component and the like. As one example, at least a portion of a simple mechanical switch or button input component that may be manipulated by the user for adjusting a variable setting of stylus 320 can be located at aperture 316. In some examples, stylus 320 can operate in a first mode when such an input component is manipulated in a first way and in a second mode when such an input component is manipulated in a second way.

Rear portion 324 of stylus 320 may provide a cosmetic end to body 322. Rear portion 324 may be formed integrally with body 322. In some examples, rear portion 324 may be formed similarly to front portion 315. For example, rear portion 324 may provide another tip feature for interacting with a surface of the touch-sensitive display of device 300 (e.g., stylus 320 may be flipped over by the user to drag portion 324 across surface of the touch-sensitive display of electronic device 300 rather than portion 315, which may enable different interactions with device 300). In some examples, rear portion 324 may include a switch or button or any other input component that may be manipulated by the user for adjusting a setting of stylus 320.

Tip portion 315 of stylus 320 may be configured to contact or nearly contact surface of the touch-sensitive display of device 300, allowing the user to use the stylus 320 to interact with the device 300. In some examples, tip 315 can include a tapered end or point, similar to a pen, which can enable the user to more precisely control stylus 320 and provide a familiar form factor. In some examples, tip 315 may be blunt or rounded, may take the form of a rotatable or fixed ball, or may have another shape. Tip 315 can include a material that can be softer than a material of the surface of the touch-sensitive display. For example, tip 315 can include a silicone, a rubber, a fluoro-elastomer, a plastic, a nylon, conductive or dielectric foam, a brass or metal ball with a polymer coating or dielectric coating (e.g., a thin coating with a high dielectric constant) or any other suitable coating, or any other suitable material or combination of materials that does not cause damage to the surface of the touch-sensitive display or layers applied to surface of the touch-sensitive display when the stylus 320 is in use.

A stylus may not include a power supply (e.g., battery or wired powered supply), and therefore may not be operative to generate any stylus electric field independently (e.g., without being stimulated by an external stimulus). Instead, a stylus may be provided with limited stylus I/O circuitry that may be operative to be stimulated by an external stimulus, such as a device stimulus that may be generated by device I/O circuitry of device I/O interface 311a of electronic device 300 (e.g., a touch-sensitive display). The device stimulus may be operative to stimulate the stylus I/O circuitry when located proximate to device I/O interface 311a. The stimulation of the stylus I/O circuitry may be operative to generate a suitable stylus electric field that may then be detected by device 300 for estimating the location of the stylus. The stylus electric field that may be distinguishable by device 300 from an electric field that may be provided by a user's direct contact with device I/O interface 311a.

Figure 4:
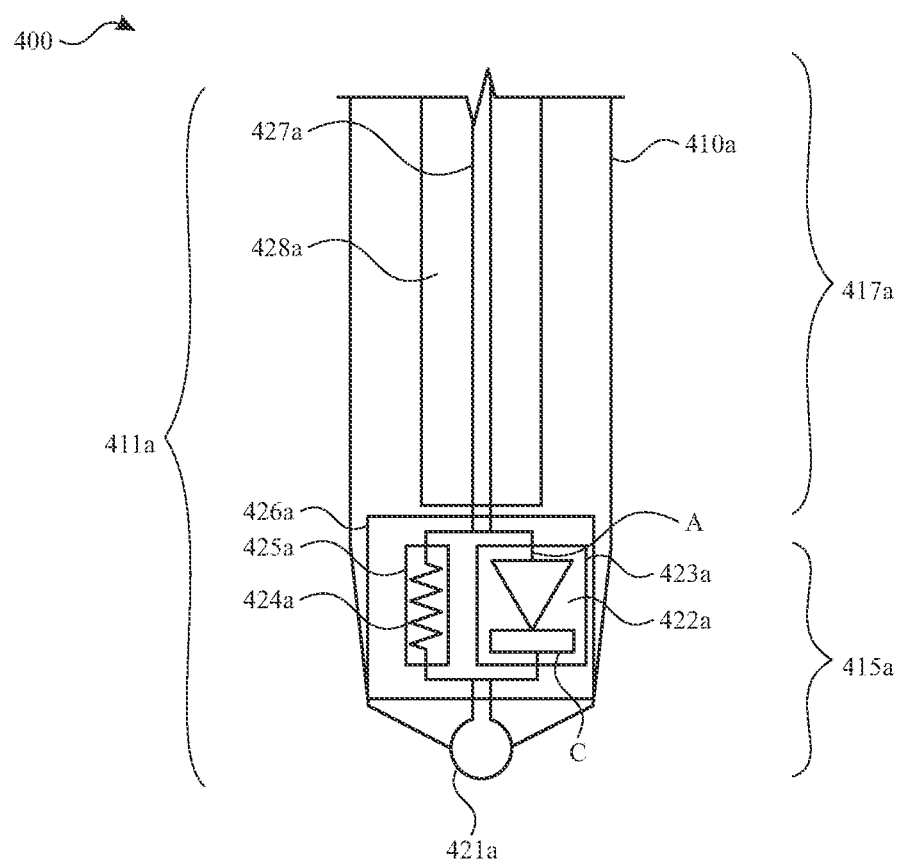
FIG. 4 illustrates an exemplary stylus according to some examples of the disclosure.

For example, FIG. 4 illustrates an exemplary stylus 400 according to some examples of the disclosure. In some examples, stylus 400 may include stylus I/O circuitry 411a. Stylus I/O circuitry 411a may operate in response to external stimulus, such as a drive signal generated by an electronic device (e.g., electronic device 136, 140, 144, 148, 150, 200, or 300). As shown by FIG. 4, for example, stylus 400 may include body portion 417a extending between a front tip portion 415a and a rear tip portion (not shown), where body portion 417a may be configured to be held by user to interact with an electronic device.

In some examples, body stylus circuitry 427a may be electrically coupled to front tip stylus circuitry 426a and/or to rear tip stylus circuitry (not shown). Body stylus circuitry 427a may be any suitable circuitry that may be operative to be electrically coupled (e.g., capacitively coupled) to a user holding stylus 400 about at least a portion of body portion 417a. As shown in FIG. 4, for example, body stylus circuitry 427a may include conductive material extending along at least a portion of a length of body portion 417a of stylus 400, which may be insulated by any suitable insulation 428a. In some examples, body stylus circuitry 427a may include a conductive (e.g., copper) tape along a portion of body 417a, where such tape may be positioned under any suitable insulation, such as a finger pad of any suitable material. The stylus can include any suitable housing 410a, such as a plastic housing. In some examples, the housing 410a can include insulation 428a. In some examples, at least a portion of body stylus circuitry 427a may be at least partially exposed via housing 410a and/or insulation 428a, thereby enabling direct contact by a user.

In some examples, stylus I/O circuitry 411a can include a front tip interface component 421a that can be included in front tip portion 415a of the stylus 400. In some examples, front tip interface component 421a can include one or more of, silicone, rubber, fluoro-elastomer, plastic, nylon, conductive or dielectric foam, metal (e.g., brass with a dielectric or polymer coating (e.g., a thin coating with a high dielectric constant)), or any other suitable material or combination of materials. The conductive material of front tip interface component 412a may be referred to herein as a tip electrode. By using such materials for the front tip interface, contact and movement of front tip interface component 421a across surface of the touch-sensitive display of electronic device 300 should not damage surface of the touch-sensitive display or layers applied to surface of the touch-sensitive display. In some examples, front tip interface component 421a can be removably attached to body 417a, such as via threadings/screws, detents and/or recesses, interference-fit or snap-fit, magnetic attraction, and the like.

Front tip stylus circuitry 426a may be positioned between and electrically coupled to front tip interface component 421a and body stylus circuitry 427a. Front tip stylus circuitry 426a can provide a non-linear load between body stylus circuitry 427a and front tip interface component 421a. In some examples, the front tip interface component 421a of stylus 400 may be stimulated by a signal that can be generated by device I/O circuitry of device I/O interface 311a of electronic device 300. For example, front tip stylus circuitry 426a may include any suitable non-linear electrical circuitry 423a that may be electrically coupled (e.g., in series) between front tip interface component 421a and body stylus circuitry 427a. For example, the non-linear circuitry 423a of stylus 400 can include at least one diode 422a, such as a Schottky diode. As shown in FIG. 4, an anode A of diode 422a may be electrically coupled to body stylus circuitry 427a and a cathode C of diode 422a may be electrically coupled to front tip interface component 421a. It should be understood, however, that it is possible to orient the diode 422a in the opposite way (e.g., connecting the anode A to the front tip interface component 421a). In some examples, the stylus 400 can include any suitable number (e.g., one or two or three or four or more) of diodes 422a. The diodes can be coupled together in series (e.g., a cathode of one diode may be coupled to an anode of a next diode) or in parallel.

Device I/O circuitry of I/O interface 311a of an electronic device 300 may provide a drive signal that can stimulate front tip interface component 421a of stylus 400 when it is proximate to or touching the surface of the touch-sensitive display of I/O interface 311a. In some examples, the drive signal can be capacitively coupled to the front tip interface component 421a of the stylus 400. A non-linear response from the stylus 400 can be transmitted via front tip interface component 421a to one or more sense electrodes of the electronic device 300, enabling the electronic device 300 to detect and locate the stylus 400.

In some examples, circuitry 426a may also include (e.g., in parallel with non-linear electrical circuitry 423a) any suitable resistance circuitry 425a (e.g., at least one resistor 424a). Resistor 424a can control reverse leakage current of non-linear electrical circuitry 423a and/or prevent direct current ("DC") positive voltage build up at the diode by, for example, draining off any DC while maintaining non-linearity of circuitry 426a. The resistance of resistor 424a may be selected in any suitable manner, such as by using a model of the panel, including its stimulation voltage and capacitance to the tip, and a model of the non-linear device. As an example, when using one or more Schottky diodes for non-linear electrical circuitry 423a, the resistance of resistor 424a can be in the range of 1-30 MΩ. In some examples, the resistance of resistor 424a can be in the range of 5-15 MΩ. In some examples, the resistance of resister 424a can be in the range of 4-6 MΩ.

In some examples, non-linear electrical circuitry 423a, may modulate and rectify a voltage on front tip interface component 421a and may provide a load (e.g., a capacitance of front tip interface component 421a) and resistance circuitry 425a, such as resistor 424a, and may be used to discharge the capacitance and/or to prevent capacitance from charging up. In some examples, a high performance and/or low capacitance and/or low voltage Schottky diode (e.g., on an insulating substrate) may be used. As another example, a diode may be made of any suitable material(s), including, but not limited to gallium arsenide and/or titanium nitride, which may have a large reverse leakage, but such leakage may be appropriately managed by resistance circuitry 425a. In some embodiments, a diode can be configured to have a current-voltage characteristic (e.g., an I-V curve) with certain properties, including, but not limited to, one with an abrupt or substantially abrupt non-linearity at a predetermined voltage and one that may maintain that voltage by balancing forward and reverse characteristics. In some examples, the materials of the diode can be selected to achieve desired performance characteristics.

Figure 5:
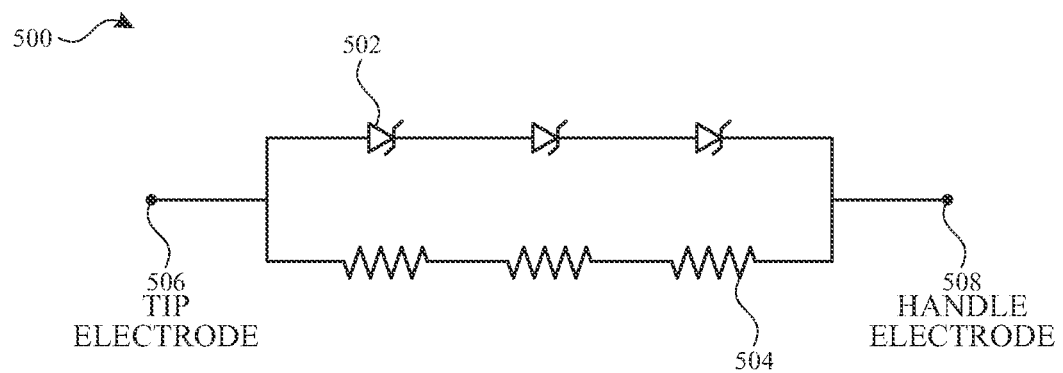
FIG. 5 illustrates a schematic diagram of front tip stylus circuitry according to some examples of the disclosure.

FIG. 5 illustrates a schematic diagram of front tip stylus circuitry 500 according to some examples of the disclosure. As discussed above, front tip stylus circuitry 500 can include a plurality of diodes 502 such as Schottky diodes connected in series, and can include resistance circuitry such as a plurality of resistors 504 connected in series. The plurality of series diodes 502 can be in parallel with the plurality of series resistors 504. This circuit configuration can generate harmonics (e.g., 2$^{nd}$ harmonics) of a stimulation signal received from a proximate electronic device, which can then be detected by the electronic device. However, unlike the front tip stylus circuitry of FIG. 4, in the example of FIG. 5 the diodes are oriented with their anodes to the left (toward tip electrode 506) and cathodes to the right (toward handle electrode 508). Handle electrode 508 can be coupled to, or otherwise formed within, a housing of the stylus and can serve as a reference ground for the stylus, and in some examples can extend along most of the length of the stylus. In some examples, handle electrode 508 can be covered by a material such as a low or high dielectric breakdown strength material. Handle electrode 508 can be capacitively coupled to a user's hand through the material. In some examples, handle electrode 508 can be directly coupled to a user's hand (e.g., via direct contact by a user to an exposed portion of handle electrode 508). Resistors 504 can be "bleed" resistors that can control the reverse leakage current of diodes 502 and prevent a DC voltage buildup at the diodes by draining off any DC voltage while maintaining the nonlinearity of the diodes.

Figure 6A:
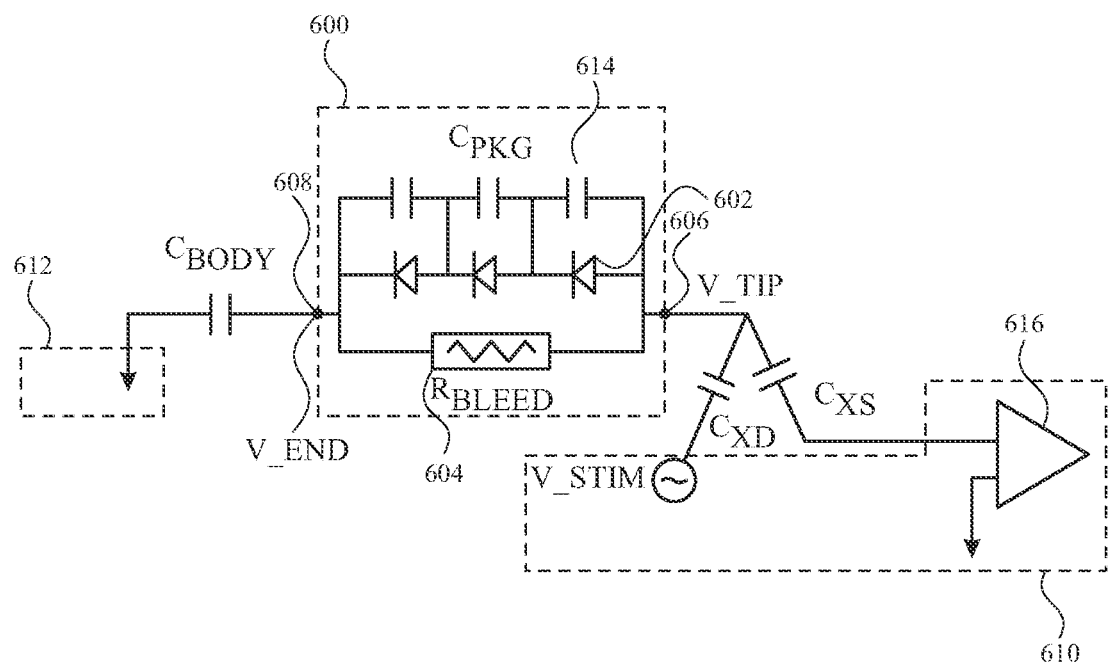
FIG. 6A is a schematic diagram of front tip stylus circuitry capacitively coupled to an electronic device and a user according to some examples of the disclosure.

FIG. 6A is a schematic diagram of front tip stylus circuitry 600 capacitively coupled to electronic device 610 and user 612 according to some examples of the disclosure. As discussed above, front tip stylus circuitry 600 can include a plurality of diodes 602 such as Schottky diodes connected in series, and can include resistance circuitry such as one or more resistors connected in series, although in the example of FIG. 6A the resistors are shown as a single resistance Rbleed 604. The plurality of series diodes 602 can be in parallel with Rbleed 604. In addition, package capacitance 614 can form across each diode 602. Handle electrode 608 can be capacitively coupled (see Cbody in FIG. 6A) to earth ground through the body of user 612. Electronic device 610 can generate an AC stimulation signal V_stim, which can capacitively couple (see Cxd in FIG. 6A) with the front tip electrode 606 having voltage V_tip. The network of front tip stylus circuitry 600 can constitute a non-linear circuit operative to provide a non-linear load. As the AC stimulation signal capacitively couples with front tip 606 of the stylus, the non-linear load provided by the parallel diode/resistor network can produce a non-linear output at the front tip that can includes frequency content including harmonics (e.g., 2$^{nd}$ harmonics) of V_stim, which can capacitively couple (see Cxs in FIG. 6A) with sense circuitry 616 within electronic device. These harmonics, including the 2$^{nd}$ harmonic of V_stim, can then be detected by the electronic device to determine the presence (touching or hovering) and location of the stylus.

Using bleed resistance 604 in parallel with one or more high frequency diodes 602 can be counterintuitive because the typical goal of high frequency diodes is to make them as nonlinear as possible and reduce their reverse leakage current. However, as described above, the leakage current of the network produces the desired output signal with the second harmonic of interest. Accordingly, examples of the disclosure add bleed resistance 604 in parallel with diodes 602 to increase the overall leakage current of the network. In essence, examples of the disclosure utilize bleed resistance 604 across diodes 602 to effectively build additional leakage into the diodes, and cause them to appear to leak more than they do intrinsically.

Figure 6B:
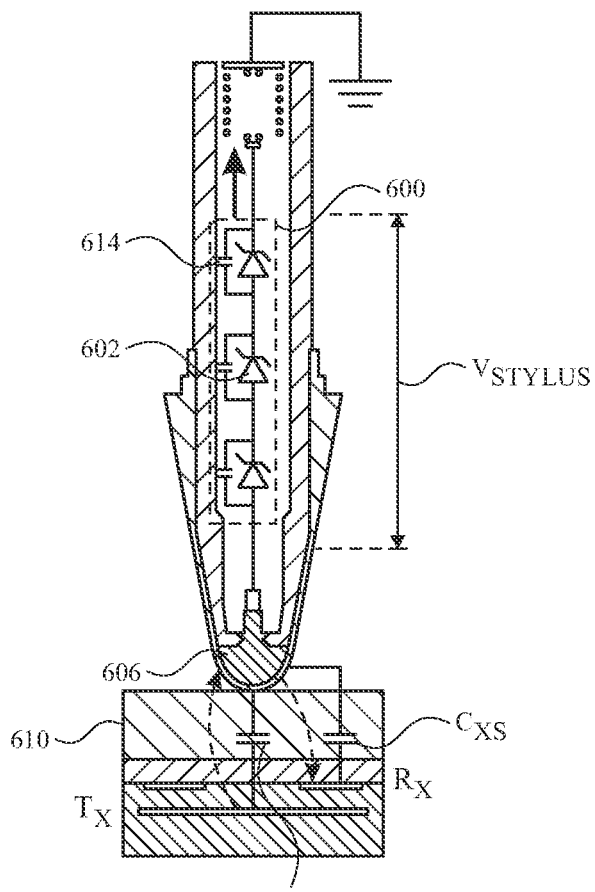
FIG. 6B is a hybrid schematic and partially symbolic cross-sectional diagram of a stylus including front tip stylus circuitry capacitively coupled to an electronic device according to some examples of the disclosure.

FIG. 6B is a hybrid schematic and partially symbolic cross-sectional diagram of a stylus including front tip stylus circuitry 600 capacitively coupled to electronic device 610 according to some examples of the disclosure. In the example of FIG. 6B, front tip stylus circuitry 600 can include a plurality of diodes 602 such as Schottky diodes connected in series, and can include resistance circuitry such as one or more resistors connected in series (although this resistance circuitry is not shown in the example of FIG. 6B to simplify the diagram). In addition, package capacitance 614 can form across each diode 602. Electronic device 610 can generate a stimulation signal on transmit electrode Tx, which can capacitively couple (see Cxd in FIG. 6B) with front tip electrode 606. The network of front tip stylus circuitry 600 can generate harmonics (e.g., 2$^{nd}$ harmonics) of the stimulation signal, which can capacitively couple (see Cxs in FIG. 6B) with sense electrode Rx within electronic device 610. The harmonics, including the 2$^{nd}$ harmonic of V_stim, can then be detected by the electronic device to determine the presence (touching or hovering) and location of the stylus.

Figure 6C:
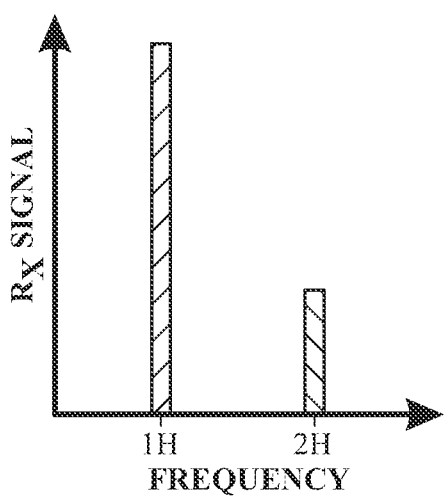
FIG. 6C is a graph that illustrates the relative signal strength of the first and second harmonics of a stimulation signal appearing on sense electrode Rx according to examples of the disclosure.

FIG. 6C is a graph that illustrates the relative signal strength of the first and second harmonics of a stimulation signal appearing on sense electrode Rx according to some examples of the disclosure. The example of FIG. 6C illustrates the amplitudes of the first harmonic 1H and the second harmonic 2H of the signal capacitively coupled onto sense electrode Rx and received by sense circuitry within the electronic device. The magnitude of the second harmonic 2H can be used to determine the presence (touching or hovering) and location of the stylus.

The second harmonic can be a function of the capacitive coupling between the stylus and the electronic device, the parasitic capacitance between the diodes within the front tip stylus circuitry and a ground sleeve, the parasitic capacitance between the diodes and the packages or traces in the stylus, and the leakage current of the front tip stylus circuitry. The leakage current can be split between the two parallel paths of the bleed resistance Rbleed and the diodes (e.g., Schottky diodes). The leakage current through the diodes can be on the same order of magnitude as the leakage current through the bleed resistance, and can have intrinsic part-to-part and batch-to-batch leakage current variations. However, unlike leakage current through the bleed resistance, which remains relatively constant over temperature, the leakage current through the diodes can change exponentially over temperature.

Figure 7A:
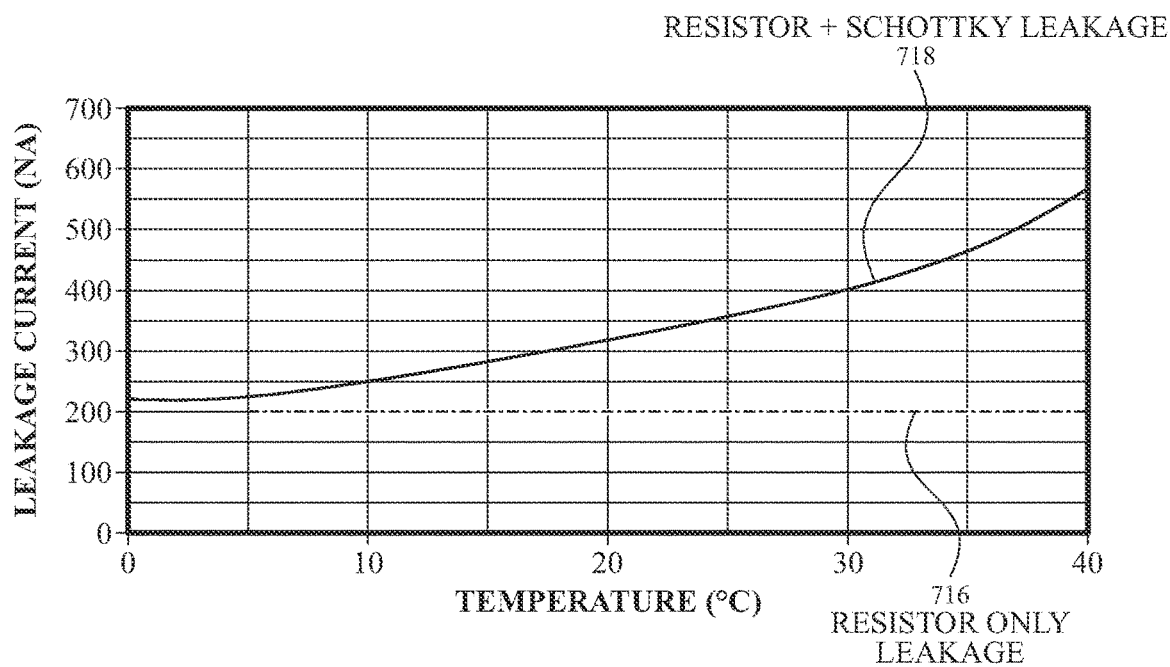
FIG. 7A is a graph of leakage current versus temperature for a bleed resistance only, and for a combined bleed resistance and a Schottky diode according to some examples of the disclosure.

FIG. 7A is a graph of leakage current versus temperature for three bleed resistors having a total resistance of 5 megohms, at 1V (see plot 716), and a graph of leakage current versus temperature for this bleed resistance in parallel with three OnSemi NSR201MX Schottky barrier diodes with 1V applied (see plot 718) according to some examples of the disclosure. In the example of FIG. 7A, plot 716 illustrates that the leakage current for a bleed resistance of 5 megohms at 1V is relatively stable at about 200 nA over the range of 5-40 degrees Celsius (C). However, when the leakage current of the bleed resistance in parallel with the Schottky diode is measured, plot 718 illustrates a relatively steep increase at higher temperatures. This large variation in diode leakage current over temperature can cause erroneous determinations of stylus presence and location.

Figure 7B:
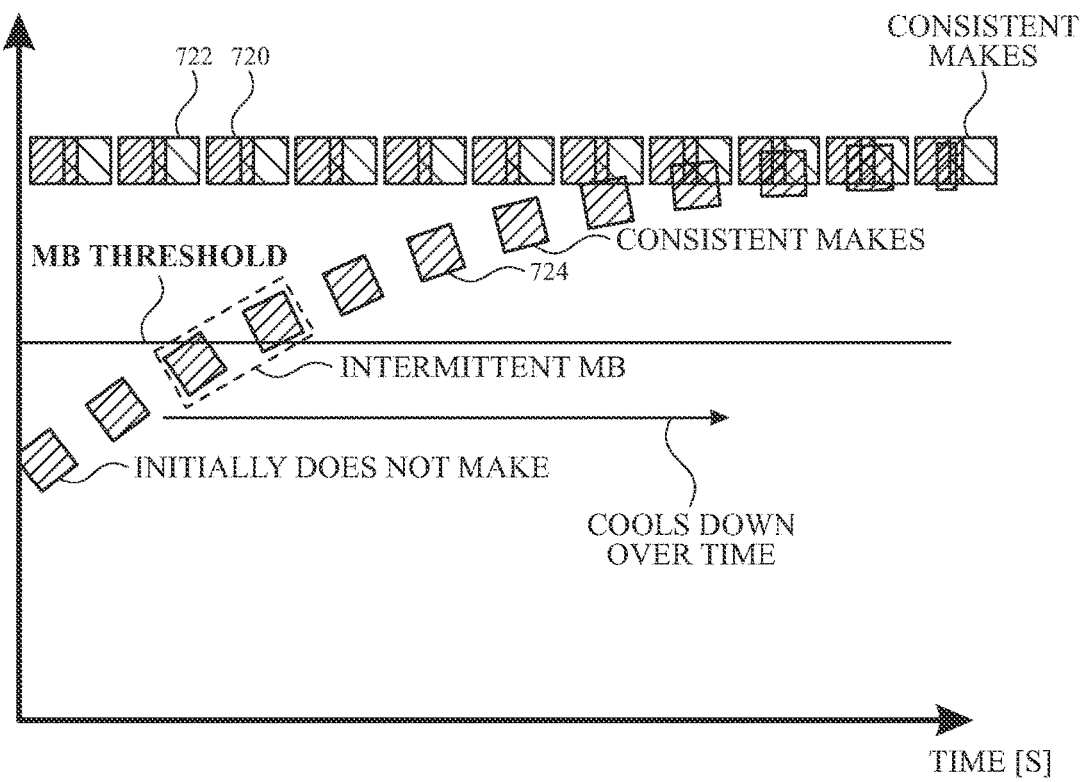
FIG. 7B is a graph of signal level (including a stylus contact make-break (MB) threshold) of a sense channel versus time according to some examples of the disclosure.

FIG. 7B is a graph of signal level (including a stylus contact make-break (MB) threshold) of a sense channel versus time according to some examples of the disclosure. In particular, the example graph of FIG. 7B is representative of the effect that diode leakage current variation over temperature can have on stylus detection performance. Plot 720 shows that the signal level of sense channel circuitry in an electronic device remains consistently above a MB threshold signal level when a stylus (including a plurality of Schottky diodes) held at a cold temperature (10 degrees C.) maintains contact with the electronic device. This constant signal level indicates that the stylus contact should be properly and consistently detected over time at cold temperatures, and can be attributed to the relatively constant leakage current of the Schottky diodes at cold temperatures, which produces a relatively constant amplitude of the second harmonic signal generated by the diode/resistor network within the stylus. Similarly, plot 722 shows that the signal level of the sense channel circuitry in the electronic device remains consistently above the MB threshold signal level when the stylus (including the plurality of Schottky diodes) held at room temperature (22 degrees C.) maintains contact with the electronic device. This constant signal level indicates that the stylus contact should be properly and consistently detected over time at room temperature, and can be attributed to the relatively constant leakage current of the Schottky diodes at room temperature, which produces a relatively constant amplitude of the second harmonic signal generated by the diode/resistor network within the stylus. Although the example of FIG. 7B shows a signal magnitude at cold temperature (plot 720) that is about the same as the signal magnitude at room temperature (plot 722), it should be understood that in other examples, the signal magnitude at cold temperatures can be lower or higher than the signal magnitude at room temperatures.

In contrast, plot 724 shows that the signal level of the sense channel circuitry in the electronic device can change significantly from below to above the MB threshold signal level when the stylus (including the plurality of Schottky diodes) is initially at high temperature (e.g., 32 degrees C.) and then cools to room temperature, even while the stylus maintains consistent contact with the electronic device. This changing signal level (despite a constant stylus contact) indicates that erroneous and/or inconsistent stylus contact results may occur over time as the stylus temperature changes, and can be attributed to the large variations in leakage current of the Schottky diodes over temperature, which produces a large variation in the amplitude of the second harmonic signal generated by the diode/resistor network within the stylus. In addition to erroneous and/or inconsistent stylus contact detection for the same stylus due to large variations in diode leakage current over temperature, part-to-part (especially Schottky diode) variations in leakage current can cause different styluses to produce different contact detection results.

Therefore, as mentioned above, it can be advantageous to reduce variations in diode leakage current over temperature by reducing the leakage current of the diodes, or by compensating for variations in leakage current over temperature. In some examples, the bleed resistance can be selected to compensate for variations in diode leakage current over temperature by reducing the overall network (resistance and diode) variation in leakage current. This can be accomplished by selecting a particular leakage resistance value, or by selecting a resistance with a particular temperature coefficient of resistance (TCR) to compensate for the leakage current trend of the diode. In other examples, the diode configuration can be modified to reduce the impact of large leakage current variations over temperature. This can be accomplished by adding more diodes, changing diode types, or by diode parameter tuning.

Some examples of the disclosure minimize the effect of large variations in diode leakage current over temperature by selecting a resistance value such that the total leakage current variation of the parallel diode/resistor network is minimized over an expected operating temperature range. Such a resistance can result in a maximized second harmonic amplitude. With reference to FIG. 6A, several considerations can inform the selection of Rbleed 604. If the resistance value is too large, the diode current can be reduced, the amplitude of the second harmonic of the signal capacitively coupled via Cxs to sense circuitry 616 can be reduced, and handle electrode 608 may not be able to discharge through Cbody. On the other hand, if the resistance value is too small, most of the leakage current can pass through the resistance, and the diodes can essentially be shorted. In this instance, the diode current may reduce to nearly zero, and the desired nonlinearities of the diodes may not produce the desired second harmonic amplitudes.

Figure 8:
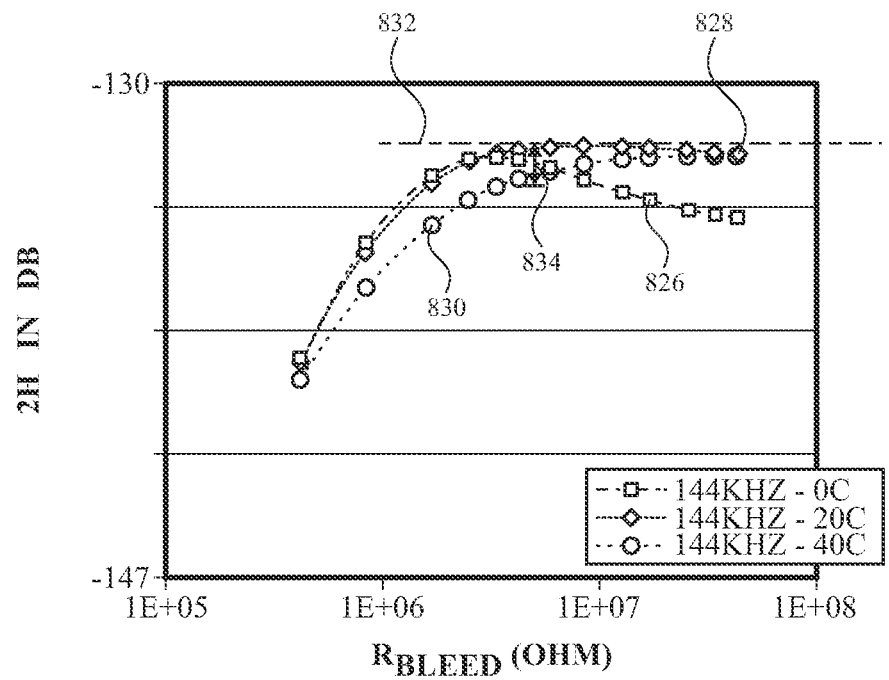
FIG. 8 is a graph of second harmonic amplitude versus bleed resistor value for several different temperatures at a given stimulation frequency according to some examples of the disclosure.

FIG. 8 is a graph of second harmonic amplitude versus bleed resistor value for several different temperatures at a given stimulation frequency according to some examples of the disclosure. In the example of FIG. 8, three plots are shown for a particular stimulation frequency of 144 kHz: plot 826 showing second harmonic amplitudes for a range of bleed resistor values at zero degrees C., plot 828 showing second harmonic amplitudes for a range of resistor values at 20 degrees C., and plot 830 showing second harmonic amplitudes for a range of resistor values at 40 degrees C. One criterion for selecting a resistance can be to select a resistor value that produces a large second harmonic amplitude, as shown in the example at 832. Another criterion for selecting a resistor can be to select a resistor value that produces a small variation in second harmonic amplitude over the temperature range of interest (e.g., 0-40 degrees C.), as shown in the example at 834. In some examples, this variation can be less than 2 dB. Another criterion for selecting a resistor can be based on the desired amount of leakage current in the resistor itself. For example, diode leakage current is significant at high temperature, so for higher temperature ranges a high resistor value with less leakage current can be indicated. However, that same high resistor value can, at low temperatures, produce so little leakage current that a second harmonic may be generated at a largely reduced magnitude. Therefore, a resistor value can be selected to be low enough to provide sufficient leakage at low temperatures, yet high enough to introduce minimal additional leakage current at high temperatures. In some examples, a resistor value can be selected such that that total leakage current of the parallel diode/resistor network (i.e., non-linear circuit) has a certain maximum variation (e.g., less than 20%, 30% or 40%) over the temperature range of interest (e.g., 0-40 degrees C.). Note that the resistor values in FIG. 8 are for a single resistor; the total resistance in a 3-resistor network would be three times what is shown in FIG. 8, for example. In the example of FIG. 8, a total resistance can be selected to be in 5-30 megohm range.

In some examples of the disclosure, an approximate total resistance can be derived. With reference to FIG. 6A, assuming reasonably matched capacitances between capacitive input Cxd, capacitive output Cxs, and the capacitance of the stylus, and reasonably matched impedances of those capacitances ($Z_{in} \approx Z_{out} \approx Z_{stylus}$), the voltage at the stylus tip can be estimated as $V\_tip = (\frac{1}{3})*V\_stim$. The input current can be defined as $I_{in} = V_{TX}*j\omega C_{in} = V_{TX}*j2\pi C_{in}$. Assuming $I_{in} = I_{stylus} + I_{out}$, then the input current at the stylus tip can be estimated as $I_{stylus} = (\frac{1}{2})*I_{in}$. The input current at the stylus tip can also be estimated as $I_{stylus} = I_{resistance} + I_{diodes} = (V\_tip/R_{leakage}) + I_{diodes,leakage}$. Combining these two estimates yields $(\frac{1}{2})*V_{TX}*j2\pi C_{in} = I_{stylus} = (V\_tip/R_{leakage}) + I_{diodes,leakage}$. Solving for $R_{leakage}$:

$$R_{leakage} = \frac{1}{3\left(\pi \cdot f \cdot C_{in} - \frac{I_{leakage,diode@V_{TX}/3/n_{diodes}}}{V_{TX}}\right)},$$

where $I_{leakage,diode}@V_{TX}/3/n_{diodes}$ is the diode leakage current divided by 3 divided by the number of diodes in series. In some examples of the disclosure, when $V_{TX}=13.5V$ and $C_{in}=100$ fF, solving this equation when the frequency is 150 kHz yields an $R_{leakage}$ of 13.4 megohms, solving this equation when the frequency is 200 kHz yields an $R_{leakage}$ of 8.2 megohms, and solving this equation when the frequency is 250 kHz yields an $R_{leakage}$ of 5.9 megohms.

Some examples of the disclosure minimize the effect of large variations in diode leakage current over temperature by selecting a resistor with a particular (positive) temperature coefficient of resistance (TCR) to at least partly compensate the diode leakage current trend (sharp rise at increasing temperatures) by having an opposing resistor leakage current variation. A resistor's TCR is the relative change in its resistance per degree of temperature change. Resistors that are deliberately designed to have a high TCR come in two types—either with a positive temperature coefficient or with a negative temperature coefficient. To counteract the diode's leakage current trend, a positive temperature coefficient is needed to increase resistance (and therefore decrease leakage current) with increasing temperature. To accomplish this, the temperature should impede the flow of electrons, which generally occurs in relatively pure metals. For example, platinum and gold resistors have TCR values of about 4000 ppm/K.

Figure 9A:
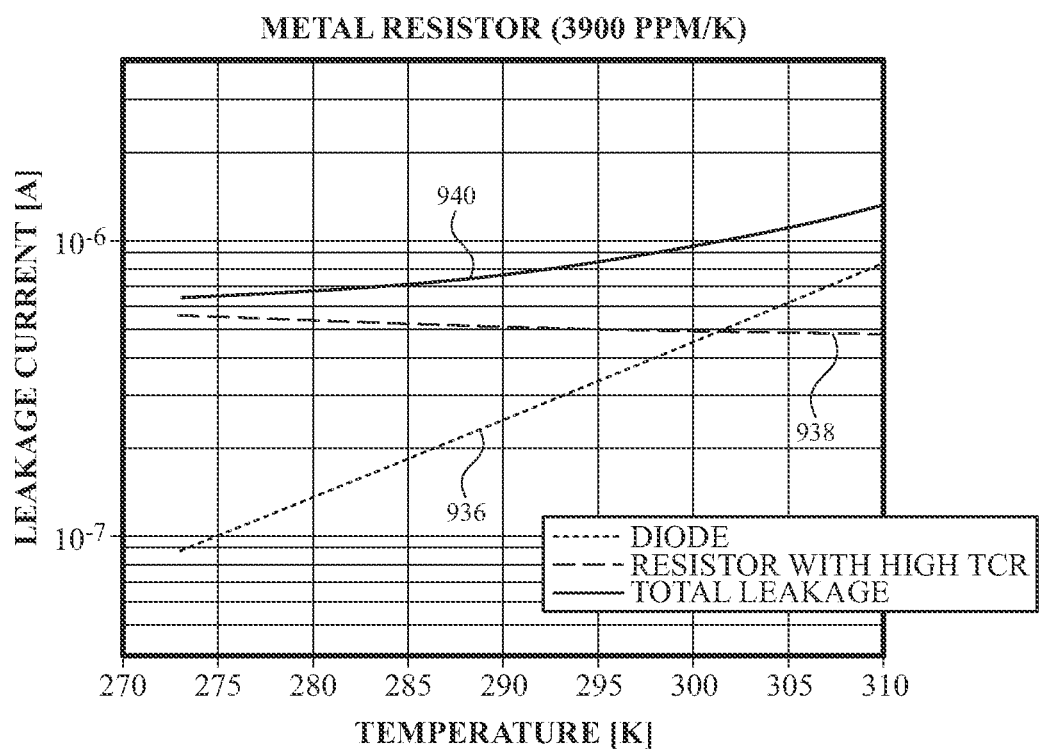
FIG. 9A is graph of leakage current versus temperature illustrating plots of a metal resistor with high (positive) TCR, a diode, and the total leakage current of the resistor and the diode according to some examples of the disclosure.

FIG. 9A is graph of leakage current versus temperature illustrating plots of a metal resistor with a high (positive) TCR, a diode, and the total leakage current of the resistor and the diode according to some examples of the disclosure. In the example of FIG. 9A, plot 936 of a diode shows increasing leakage current with increasing temperature. Plot 938 of a resistor with high (positive) TCR shows that its leakage current decreases with increasing temperature, which tends to counteract the diode's leakage current trend. Plot 940 of the total leakage current shows that by using a resistor with a high (positive) TCR, the overall leakage current trend is somewhat flattened as compared to the diode leakage current trend.

Figure 9B:
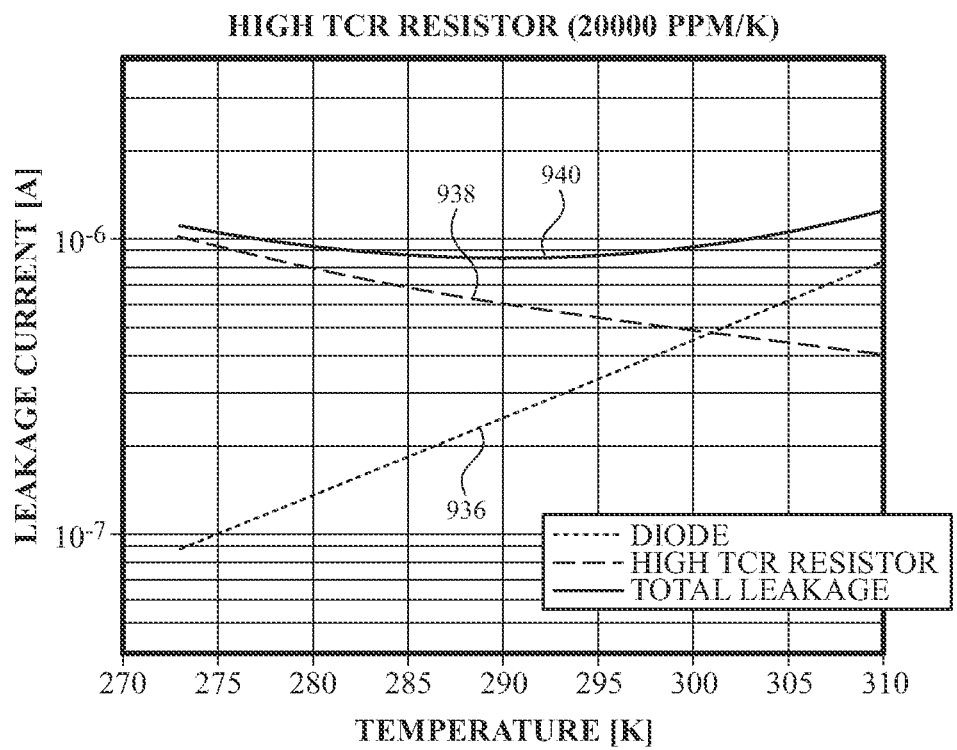
FIG. 9B is graph of leakage current versus temperature illustrating plots of a resistor with very high (positive) TCR, a diode, and the total leakage current of the resistor and the diode according to some examples of the disclosure.

FIG. 9B is graph of leakage current versus temperature illustrating plots of a resistor with very high (positive) TCR, a diode, and the total leakage current of the resistor and the diode according to some examples of the disclosure. In the example of FIG. 9B, plot 936 of a diode shows increasing leakage current with increasing temperature. Plot 938 of a resistor with very high (positive) TCR (e.g., a TCR of 10000-30000) shows that its leakage current decreases more sharply with increasing temperature that the metal resistor of FIG. 9A, which tends to more effectively counteract the diode's leakage current trend. Plot 940 of the total leakage current shows that by using a resistor with very high (positive) TCR, the overall leakage current trend is flattened as compared to the diode leakage current trend.

Figure 9C:
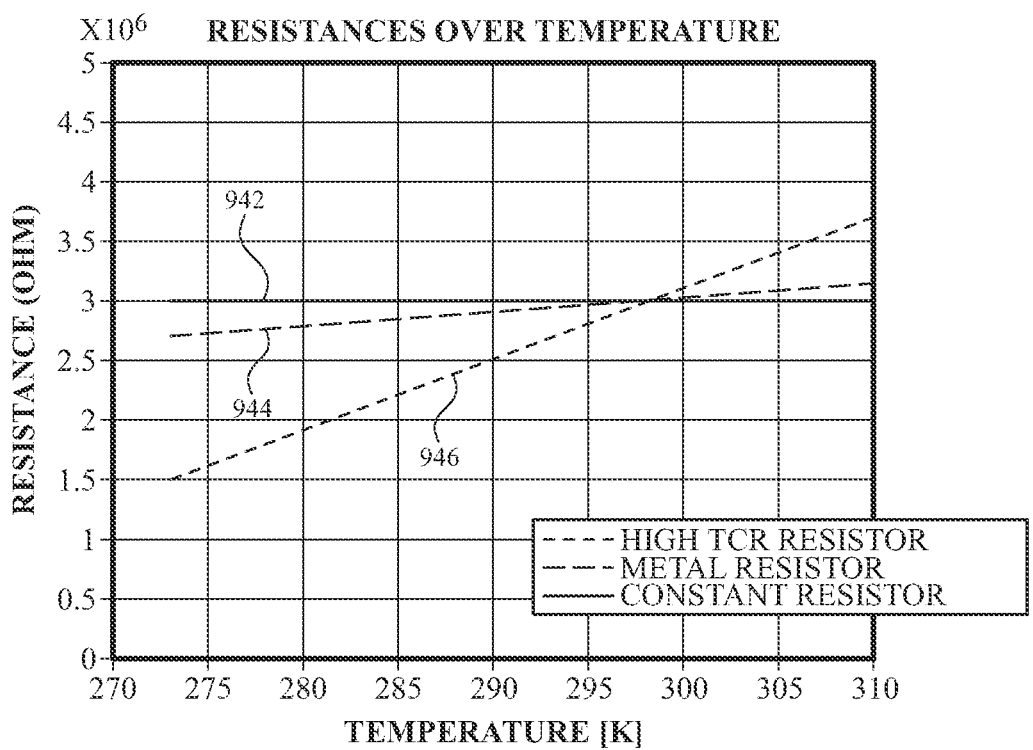
FIG. 9C is a graph of resistance versus temperature illustrating plots of a constant resistor, a metal resistor and a very high TCR resistor according to some examples of the disclosure.

FIG. 9C is a graph of resistance versus temperature illustrating plots of a constant resistor, a metal resistor and a very high TCR resistor, all having a nominal 3 megohm resistance at 25 degrees C., according to some examples of the disclosure. In the example of FIG. 9C, plot 942 illustrates a constant resistor whose resistance does not change over temperature. Plot 944 (corresponding to FIG. 9A) illustrates a metal resistor with a high (positive) TCR that increases its resistance with increasing temperature. Plot 946 (corresponding to FIG. 9B) illustrates a resistor with a very high (positive) TCR that more dramatically increases its resistance with increasing temperature.

Other examples of the disclosure can utilize positive temperature coefficient (PTC) thermistors whose resistance increases significantly with higher temperatures. Like high (positive) TCR resistors, PTC thermistors can also decrease leakage current at high temperatures and also flatten the leakage curve. In other examples, thermal switches that open at high temperatures can remove resistance from the network and decrease leakage current at high temperatures, and can also flatten the leakage curve.

Although the examples of the disclosure illustrated and discussed above show three diodes in series, it should be understood that other number of diodes can be employed, such as two to six diodes, for example. Adding more diodes can reduce the overall leakage current variation over temperature for the parallel diode/resistor network in the stylus, as described below. Increasing the number of diodes results in a voltage divider for the stylus tip voltage V_tip and a smaller reverse voltage drop over each diode. The effective leakage resistance of a diode can be represented as $V_{reverse,diode}/I_{leakage\ diode}$. Because a small reduction in a diode's reverse voltage produces a large, roughly exponential reduction in diode leakage current, as the reverse voltage drop over each diode decreases with more diodes in series, the reduction in leakage current becomes comparatively larger (i.e., the numerator in the effective leakage resistance equation gets smaller), and the effective leakage resistance of the diode increases, which can result in a lower leakage current variation at high temperatures.

However, there can be tradeoffs—although more diodes in series can lead to lower effective diode parasitic capacitance because the diodes act as a capacitance divider, the parasitic capacitance can nevertheless lead to a significant reduction in the amplitude of the second harmonic generated by the parallel diode/resistor network due to the reduction in leakage current. In addition, because diode forward voltage is indirectly related to reverse voltage due to the diode barrier height, the forward voltage can also a function of leakage current. A desired low leakage current diode can therefore also have a higher forward voltage, which can add up when diodes are connected in series and make them harder to conduct in the forward direction (and in the reverse direction). Thus, in other examples, instead of utilizing a relatively large number of diodes in series (e.g., 5 or 6 diodes), a diode can be designed to have low leakage current and a higher forward voltage, and only one (or a small number) of these diodes can be employed in parallel with the resistor(s) of the network.

Figure 10A:
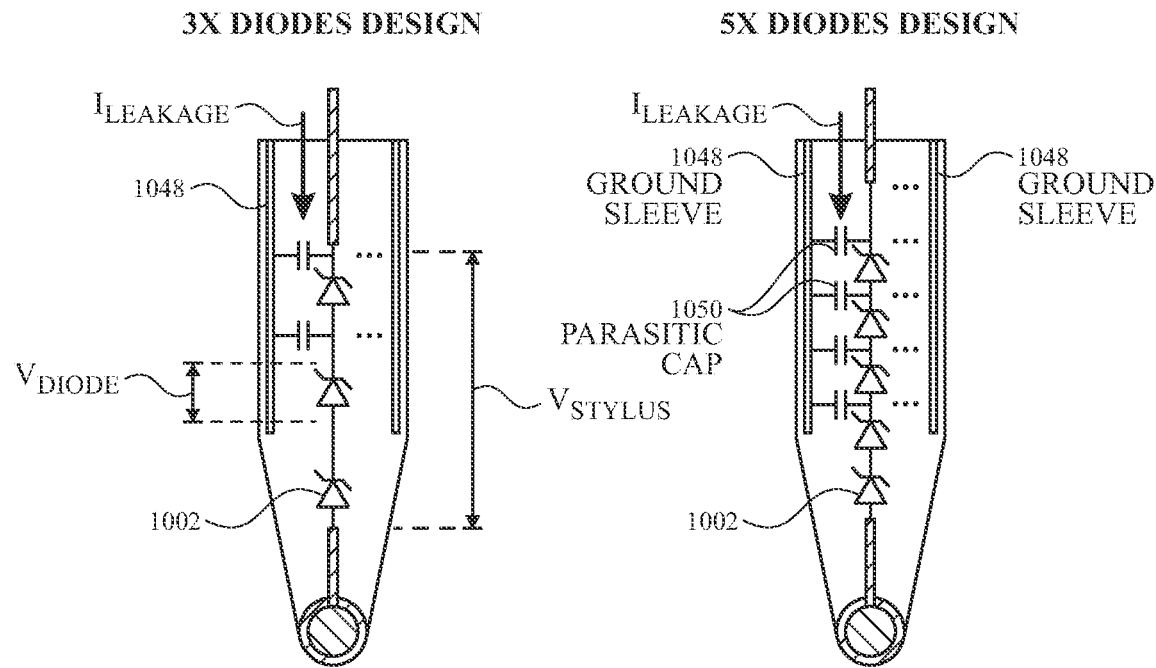
FIG. 10A is a hybrid schematic and symbolic cross-sectional view of a three diode design and a five diode design in a stylus having an extended ground sleeve according to some examples of the disclosure.

FIG. 10A is a hybrid schematic and symbolic cross-sectional view of a three diode design and a five diode design in a stylus having extended ground sleeve 1048 according to some examples of the disclosure. In the example of FIG. 10A, the bleed resistors in parallel with the diodes are not shown for purpose of simplifying the figures. Regarding the differences in the five diode design as compared to the three diode design in FIG. 10A, while the leakage current can decrease and the parasitic capacitance of individual diodes 1002 can also decrease as discussed above, ground sleeve 1048 can cause an increase in parasitic capacitance 1050 between the diodes and the sleeve, which can lead to a significant reduction in the amplitude of the second harmonic generated by the parallel diode/resistor network due to the reduction in leakage current.

Thus, in determining the number of series diodes to use in the parallel diode/resistor network, examples of the disclosure can take into account several parasitic capacitive coupling factors, including but not limited to parasitic capacitive coupling 1050 with ground sleeve 1048, parasitic capacitive coupling with the stylus packaging or traces, and parasitic capacitive coupling with other components such as the resistors or other diodes. In other words, a multiple series diode configuration according to examples of the disclosure can consider the combined effects of an integrated package which includes diodes, leakage (bleed) resistors, and optionally ESD protection circuitry to reduce parasitic capacitive coupling between them. For example, to reduce parasitic capacitance in multi-diode configurations, the diodes can be spread out on a large substrate so no pads are required between them. In other examples, wire bonding can be used between die within a package instead of having a complete package for each die.

Figure 10B:
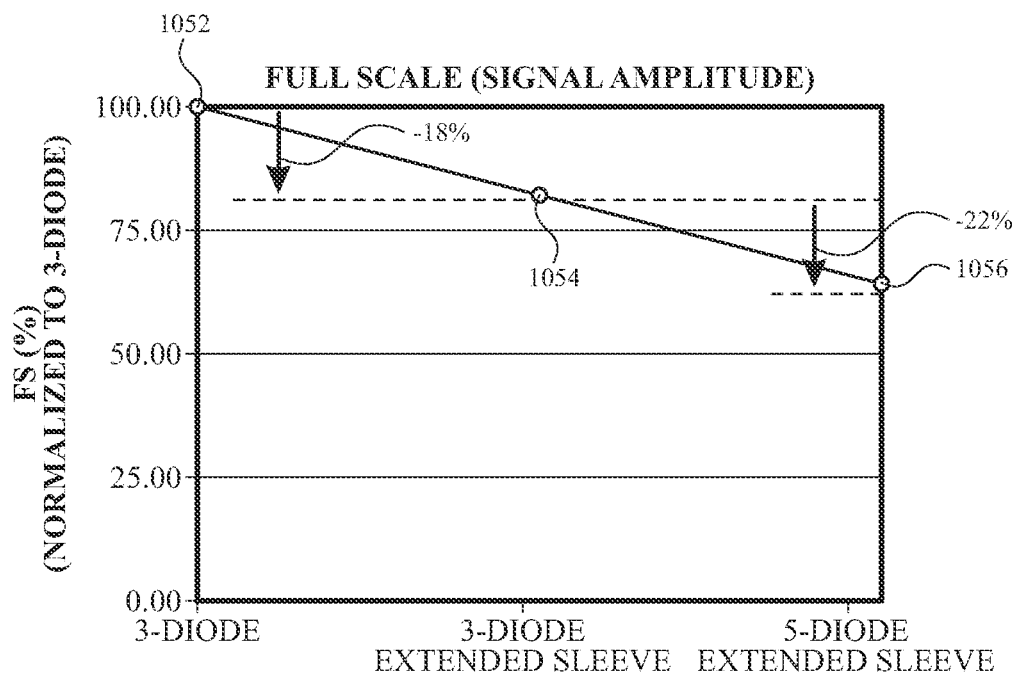
FIG. 10B is a graph of the signal amplitude of the second harmonic of several parallel diode/resistor network designs according to some examples of the disclosure.

FIG. 10B is a graph of the signal amplitude of the second harmonic of several parallel diode/resistor network designs according to some examples of the disclosure. In the example of FIG. 10B, the signal amplitude has been normalized to the full-scale amplitude of a three diode implementation with no ground sleeve. As shown in FIG. 10B, at 1052 the full-scale amplitude of a three-diode implementation with no ground sleeve produces a normalized 100% signal amplitude. However, when extended ground sleeve 1048 is added to the stylus, the signal amplitude can drop to about 82% of the no-sleeve implementation (see 1054) due to the increased parasitic capacitance 1050 reducing the leakage current. When a five-diode design is employed with extended ground sleeve 1048, the signal can drop an additional 22% below the three-diode with sleeve implementation (see 1056). Thus, selection of a multi-diode design may need to consider the effect of multiple diodes on the amplitude of the second harmonic and whether a sufficient signal-to-noise ratio (SNR) is being maintained. In some examples, due to this rejection in second harmonic amplitude, an optimum operating design can utilize three Schottky diodes.

The selection of the number of diodes to place in series in the parallel diode/resistor network configuration to reduce the effect of leakage current variations over temperature can therefore be a function of the reduction in leakage current and the increase in forward voltage that can result from additional diodes, and the additional parasitic capacitance that can result from additional diodes. In general, whether multiple diodes or a single diode is employed, a low parasitic capacitance, a low forward voltage, and a temperature invariant low leakage current can be desirable.

In some examples of the disclosure, in addition to, or as an alternative to selecting the number of diodes to employ in the parallel diode/resistor network, specific types of diodes can be selected that trade off leakage current versus other parameters. For example, very low leakage diodes can be selected for the network. If the diode leakage is very low to begin with, then even if the leakage current increases significantly over temperature, any increases in leakage current can be negligible as compared to a dominant resistor leakage current. The selection of a diode type can involve consideration of a number of parameters including, but not limited to leakage current, total capacitance, forward voltage, and electrostatic discharge (ESD) hardness.

Regarding leakage current, as mentioned above, a diode type can be selected that has low leakage as compared to the leakage current of the bleed resistor. Over the expected variations in temperature, although the leakage current of the diode may experience an order of magnitude variation, because the baseline leakage is small, the absolute variation can be small enough as compared to the leakage current of the bleed resistor to be negligible. However, it should be noted that purely resistive leakage currents from the diode and the bleed resistor are not the only leakage currents that may need to be considered. At the frequencies of interest (e.g., hundreds of kHz), a parasitic capacitance of 1 pf may be non-negligible. For example, a parasitic capacitance of 1 pF at 200 kHz over a 1.5V single diode drop can lead to significant leakage current of 1800 nA through the parasitic capacitive coupling.

In some examples of the disclosure, a diode can be selected that has a low reverse leakage current (in a 0-3V reverse bias range). For example, at a reverse voltage of 1.5V, a diode can be selected with 100 nA, 200 nA, or 400 nA of leakage current to be guaranteed over temperatures from 0-40 degrees C. A diode can also be selected with a low total capacitance of 0.1 pF, 0.15 pF, or 0.2 pF to be guaranteed over temperatures from 0-40 degrees C., for example. A diode can be further selected (in a 0.1 A to 10 uA forward current range) to have a low forward voltage of 0.01 to 0.1 V, for example.

Diode types that can be considered for selection include, but are not limited to, GaAs diodes, tantalum, titanium, or other semiconductor material diodes. GaAs diodes, for example, generally have low leakage current, low total parasitic capacitance, but a large forward voltage. GaAs is available in a semi-insulating form so that large capacitances to the substrate can be avoided. Silicon diodes with insulating substrates can also be selected to reduce capacitances to the substrate.

In some examples of the disclosure, the desired diode parameters can be achieved not by selecting a particular diode type, but rather by selecting individual diodes possessing the desired parameters and taking advantage of manufacturing differences that result in part-to-part parameter variations. In one example, Schottky diodes having less than 600 nA of leakage current over the temperature range of interest, less than 0.1 pF of total capacitance, and a forward turn-on voltage of about 2V can be selected and employed in the parallel diode/resistor network.

Although various examples of reducing the effect of variations in diode leakage current may be described above in different paragraphs and shown in different figures for convenience of explanation, it should be understood that different permutations and combinations of these features are contemplated in different examples of the disclosure.

Therefore, according to the above, some examples of the disclosure are directed to a stylus comprising a housing and a non-linear circuit at least partially positioned within the housing that is operative to provide a non-linear load when the stylus is stimulated by an external stimulation signal, the non-linear load operative to provide a stylus electric field that is detectable by an electronic device in proximity to the stylus, wherein the non-linear circuit comprises one or more bleed resistors with a total resistance in a range between 1-30 MOhms and one or more Schottky diodes with a leakage current less than about 600 nA, and wherein the total leakage current of the non-linear circuit has a variation less than 20% in a temperature range between 0-40° C. As an alternative to or in addition to one more of the examples disclosed above, in some examples the non-linear circuit comprises one or more bleed resistors with a total resistance in a range between 5-30 MOhms. As an alternative to or in addition to one more of the examples disclosed above, in some examples the non-linear circuit comprises one or more Schottky diodes with a leakage current less than about 400 nA. As an alternative to or in addition to one more of the examples disclosed above, in some examples the stylus electric field is operative to capacitively couple a response signal including a second harmonic of the stimulation signal onto the electronic device, the second harmonic having a first amplitude, and wherein the total resistance of the one or more bleed resistors is selected to be a particular total resistance within the range of 1-30 MOhms that produces a largest first amplitude of the second harmonic within that range. As an alternative to or in addition to one more of the examples disclosed above, in some examples the total resistance of the one or more bleed resistors is selected to be a particular total resistance within the range of 5-30 MOhms that produces a largest first amplitude of the second harmonic within that range. As an alternative to or in addition to one more of the examples disclosed above, in some examples the particular total resistance is further selected within the range of 1-30 MOhms to also produce a variation of the first amplitude of less than 3 dB over the temperature range between 0° C.-40° C. As an alternative to or in addition to one more of the examples disclosed above, in some examples the particular total resistance is further selected within the range of 5-30 MOhms. As an alternative to or in addition to one more of the examples disclosed above, in some examples the particular total resistance is further selected to also produce a variation of the first amplitude of less than 2 dB over the temperature range between 0° C.-40° C. As an alternative to or in addition to one more of the examples disclosed above, in some examples the one or more bleed resistors have a positive temperature coefficient of resistance (TCR) in a range between about 4000-30000 ppm/K. As an alternative to or in addition to one more of the examples disclosed above, in some examples the one or more bleed resistors have a positive temperature coefficient of resistance (TCR) of around 4000 ppm/K. As an alternative to or in addition to one more of the examples disclosed above, in some examples the one or more bleed resistors are connected in series, the one or more Schottky diodes are connected in series, and the series connections of the bleed resistors and the Schottky diodes are connected in parallel. As an alternative to or in addition to one more of the examples disclosed above, in some examples the non-linear circuit comprises three Schottky diodes. As an alternative to or in addition to one more of the examples disclosed above, in some examples the one or more Schottky diodes have a total capacitance of less than 0.2 pF and a forward voltage of less than 0.1 V.

Some examples of the disclosure are directed to an input device, comprising a parallel diode and resistance network configured to receive a capacitively coupled stimulation signal and generate a response signal capable of capacitively coupling to an electronic device in proximity to the stylus, the response signal including a second harmonic of the stimulation signal, wherein the network comprises one or more bleed resistors with a particular total resistance within a range between 1-30 MOhms selected to produce a variation of a first amplitude of the second harmonic of less than 3 dB over a temperature range between 0° C.-40° C. As an alternative to or in addition to one more of the examples disclosed above, in some examples the network comprises one or more bleed resistors with a particular total resistance within a range between 5-30 MOhms. As an alternative to or in addition to one more of the examples disclosed above, in some examples the one or more bleed resistors are selected to produce a variation of a first amplitude of the second harmonic of less than 2 dB over a temperature range between 0° C.-40° C. As an alternative to or in addition to one more of the examples disclosed above, in some examples the particular total resistance is further selected within the range of 1-30 MOhms to produce a largest first amplitude of the second harmonic within that range. As an alternative to or in addition to one more of the examples disclosed above, in some examples the particular total resistance is further selected within the range of 5-30 MOhms to produce a largest first amplitude of the second harmonic within that range. As an alternative to or in addition to one more of the examples disclosed above, in some examples the network includes one or more Schottky diodes with a leakage current less than about 600 nA, a total capacitance of less than 0.2 pF and a forward voltage of less than 0.1 V. As an alternative to or in addition to one more of the examples disclosed above, in some examples the network includes one or more Schottky diodes with a leakage current less than about 400 nA, a total capacitance of less than 0.2 pF and a forward voltage of less than 0.1 V. As an alternative to or in addition to one more of the examples disclosed above, in some examples the one or more bleed resistors have a positive temperature coefficient of resistance (TCR) in a range between about 4000-30000 ppm/K. As an alternative to or in addition to one more of the examples disclosed above, in some examples the one or more bleed resistors have a positive temperature coefficient of resistance (TCR) of around 4000 ppm/K. As an alternative to or in addition to one more of the examples disclosed above, in some examples the network comprises three Schottky diodes. As an alternative to or in addition to one more of the examples disclosed above, in some examples a total leakage current of the network has a variation of less than 20% in the temperature range between 0–40° C.

Some examples of the disclosure are directed to an input device, comprising a parallel diode and resistance network configured to receive a capacitively coupled stimulation signal and generate a response signal capable of capacitively coupling to an electronic device in proximity to the input device, the response signal including a second harmonic of the stimulation signal, wherein the network comprises one or more diodes and one or more bleed resistors, the one or more bleed resistors having a total positive temperature coefficient of resistance (TCR) in a range between about 4000-30000 ppm/K selected to offset variations in leakage current from the plurality of diodes over a temperature range between 0° C.-40° C. As an alternative to or in addition to one more of the examples disclosed above, in some examples the one or more bleed resistors have a total positive temperature coefficient of resistance (TCR) of about 4000 ppm/K selected to offset variations in leakage current from the plurality of diodes over a temperature range between 0° C.-40° C. As an alternative to or in addition to one more of the examples disclosed above, in some examples the one or more bleed resistors are further selected with a particular total resistance within a range between 1-30 MOhms to produce a variation of a first amplitude of the second harmonic of less than 3 dB over the temperature range between 0° C.-40° C. As an alternative to or in addition to one more of the examples disclosed above, in some examples the one or more bleed resistors are further selected with a particular total resistance within a range between 5-30 MOhms. As an alternative to or in addition to one more of the examples disclosed above, in some examples the one or more bleed resistors are further selected to produce a variation of a first amplitude of the second harmonic of less than 2 dB over the temperature range between 0° C.-40° C. As an alternative to or in addition to one more of the examples disclosed above, in some examples the particular total resistance is further selected within the range of 1-30 MOhms to produce a largest first amplitude of the second harmonic within that range. As an alternative to or in addition to one more of the examples disclosed above, in some examples the particular total resistance is further selected within the range of 5-30 MOhms to produce a largest first amplitude of the second harmonic within that range. As an alternative to or in addition to one more of the examples disclosed above, in some examples the one or more diodes comprise Schottky diodes with a leakage current less than about 600 nA, a total capacitance of less than 0.2 pF and a forward voltage of less than 0.1 V. As an alternative to or in addition to one more of the examples disclosed above, in some examples the one or more diodes comprise Schottky diodes with a leakage current less than 400 nA, a total capacitance of less than 0.2 pF and a forward voltage of less than 0.1 V. As an alternative to or in addition to one more of the examples disclosed above, in some examples the network comprises three Schottky diodes. As an alternative to or in addition to one more of the examples disclosed above, in some examples a total leakage current of the network has a variation of less than 20% in the temperature range between 0-40° C.

Some examples of the disclosure are directed to an input device, comprising a parallel diode and resistance network configured to receive a capacitively coupled stimulation signal and generate a response signal capable of capacitively coupling to an electronic device in proximity to the input device, the response signal including a second harmonic of the stimulation signal, wherein the network comprises one or more diodes and one or more bleed resistors, the one or more bleed resistors having a particular total resistance within a range between 1-30 MOhms selected to produce a largest first amplitude of the second harmonic over a temperature range between 0° C.-40° C. As an alternative to or in addition to one more of the examples disclosed above, in some examples the network comprises one or more diodes and one or more bleed resistors, the one or more bleed resistors having a particular total resistance within a range between 5-30 MOhms selected to produce a largest first amplitude of the second harmonic over a temperature range between 0° C.-40° C. As an alternative to or in addition to one more of the examples disclosed above, in some examples the particular total resistance is further selected within the range between 1-30 MOhms to produce a variation of the first amplitude of the second harmonic of less than 3 dB over the temperature range between 0° C.-40° C. As an alternative to or in addition to one more of the examples disclosed above, in some examples the particular total resistance is further selected within the range between 5-30 MOhms. As an alternative to or in addition to one more of the examples disclosed above, in some examples the particular total resistance is further selected to produce a variation of the first amplitude of the second harmonic of less than 2 dB over the temperature range between 0° C.-40° C. As an alternative to or in addition to one more of the examples disclosed above, in some examples the one or more bleed resistors having a total positive temperature coefficient of resistance (TCR) in a range between about 4000-30000 ppm/K selected to offset variations in leakage current from the one or more diodes over the temperature range between 0° C.-40° C. As an alternative to or in addition to one more of the examples disclosed above, in some examples the one or more bleed resistors having a total positive temperature coefficient of resistance (TCR) of about 4000 ppm/K selected to offset variations in leakage current from the one or more diodes over the temperature range between 0° C.-40° C. As an alternative to or in addition to one more of the examples disclosed above, in some examples the one or more diodes comprise Schottky diodes with a leakage current less than about 600 nA, a total capacitance of less than 0.2 pF and a forward voltage of less than 0.1 V. As an alternative to or in addition to one more of the examples disclosed above, in some examples the one or more diodes comprise Schottky diodes with a leakage current less than 400 nA, a total capacitance of less than 0.2 pF and a forward voltage of less than 0.1 V. As an alternative to or in addition to one more of the examples disclosed above, in some examples the network comprises three Schottky diodes. As an alternative to or in addition to one more of the examples disclosed above, in some examples a total leakage current of the network has a variation of less than 20% in the temperature range between 0-40° C.

Although the disclosed examples have been fully described with reference to the accompanying drawings, it is to be noted that various changes and modifications will become apparent to those skilled in the art. Such changes and modifications are to be understood as being included within the scope of the disclosed examples as defined by the appended claims.

What is claimed is:

1. A stylus comprising:
   a housing; and
   a non-linear circuit at least partially positioned within the housing that is operative to provide a non-linear load when the stylus is stimulated by an external stimulation signal, the non-linear load operative to provide a stylus electric field that is detectable by an electronic device in proximity to the stylus;
   wherein the non-linear circuit comprises one or more bleed resistors with a total resistance in a range between 1-30 MOhms and one or more Schottky diodes with a leakage current less than about 600 nA; and
   wherein a total leakage current of the non-linear circuit has a variation less than 20% in a temperature range between 0-40° C.

2. The stylus of claim 1, the stylus electric field operative to capacitively couple a response signal including a second harmonic of the external stimulation signal onto the electronic device, the second harmonic having a first amplitude;
   wherein the total resistance of the one or more bleed resistors is selected to be a particular total resistance within the range of 1-30 MOhms that produces a largest first amplitude of the second harmonic within that range.

3. The stylus of claim 2, wherein the particular total resistance is further selected within the range of 1-30 MOhms to also produce a variation of the first amplitude of less than 3 dB over the temperature range between 0° C.-40° C.

4. The stylus of claim 1, wherein the one or more bleed resistors have a positive temperature coefficient of resistance (TCR) in a range between about 4000-30000 ppm/K.

5. The stylus of claim 1, wherein the one or more bleed resistors are connected in series, the one or more Schottky diodes are connected in series, and the series connections of the bleed resistors and the Schottky diodes are connected in parallel.

6. The stylus of claim 1, wherein the non-linear circuit comprises three Schottky diodes.

7. The stylus of claim 1, wherein the one or more Schottky diodes have a total capacitance of less than 0.2 pF and a forward voltage of less than 0.1 V.

8. An input device, comprising:
a parallel diode and resistance network configured to receive a capacitively coupled stimulation signal and generate a response signal capable of capacitively coupling to an electronic device in proximity to the input device, the response signal including a second harmonic of the capacitively coupled stimulation signal;
wherein the network comprises one or more bleed resistors with a particular total resistance within a range between 1-30 MOhms selected to produce a variation of a first amplitude of the second harmonic of less than 3 dB over a temperature range between 0° C.-40° C.

9. The input device of claim 8, wherein the particular total resistance is further selected within the range of 1-30 MOhms to produce a largest first amplitude of the second harmonic within that range.

10. The input device of claim 8, wherein the network includes one or more Schottky diodes with a leakage current less than about 600 nA, a total capacitance of less than 0.2 pF and a forward voltage of less than 0.1 V.

11. The input device of claim 8, wherein the one or more bleed resistors have a positive temperature coefficient of resistance (TCR) in a range between about 4000-30000 ppm/K.

12. The input device of claim 8, wherein the network comprises three Schottky diodes.

13. The input device of claim 8, wherein a total leakage current of the network has a variation of less than 20% in the temperature range between 0–40° C.

14. An input device, comprising:
a parallel diode and resistance network configured to receive a capacitively coupled stimulation signal and generate a response signal capable of capacitively coupling to an electronic device in proximity to the input device, the response signal including a second harmonic of the stimulation signal;
wherein the network comprises one or more diodes and one or more bleed resistors, the one or more bleed resistors having a particular total resistance within a range between 1-30 MOhms selected to produce a largest first amplitude of the second harmonic over a temperature range between 0° C.-40° C.

15. The input device of claim 14, wherein the particular total resistance is further selected within the range between 1-30 MOhms to produce a variation of the first amplitude of the second harmonic of less than 3 dB over the temperature range between 0° C.-40° C.

16. The input device of claim 14, the one or more bleed resistors having a total positive temperature coefficient of resistance (TCR) in a range between about 4000-30000 ppm/K selected to offset variations in leakage current from the one or more diodes over the temperature range between 0° C.-40° C.

17. The input device of claim 14, wherein the one or more diodes comprise Schottky diodes with a leakage current less than about 600 nA, a total capacitance of less than 0.2 pF and a forward voltage of less than 0.1 V.

18. The input device of claim 14, wherein the network comprises three Schottky diodes.

19. The input device of claim 14, wherein a total leakage current of the network has a variation of less than 20% in the temperature range between 0-40° C.

* * * * *